(12) United States Patent
Takaishi

(10) Patent No.: US 8,372,724 B2
(45) Date of Patent: Feb. 12, 2013

(54) DEVICE AND MANUFACTURING METHOD THEREOF

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 126 days.

(21) Appl. No.: 12/781,429

(22) Filed: May 17, 2010

(65) Prior Publication Data

US 2010/0295110 A1    Nov. 25, 2010

(30) Foreign Application Priority Data

May 22, 2009    (JP) ................................. 2009-123778

(51) Int. Cl.
    *H01L 21/20*    (2006.01)
(52) U.S. Cl. ...................................... 438/386
(58) Field of Classification Search .................... 438/386
    See application file for complete search history.

(56) References Cited

U.S. PATENT DOCUMENTS

| | | | | |
|---|---|---|---|---|
| 5,812,364 | A * | 9/1998 | Oku et al. | ...................... 361/312 |
| 2004/0206956 | A1* | 10/2004 | Yanai et al. | ...................... 257/59 |
| 2009/0090947 | A1* | 4/2009 | Yoon et al. | ...................... 257/296 |
| 2009/0258470 | A1* | 10/2009 | Choi et al. | ...................... 438/386 |

FOREIGN PATENT DOCUMENTS

| | | |
|---|---|---|
| JP | 4-025171 | 1/1992 |
| JP | 2000-150826 | 5/2000 |
| JP | 2001-189434 | 7/2001 |

* cited by examiner

*Primary Examiner* — Charles Garber
*Assistant Examiner* — Andre' C Stevenson
(74) *Attorney, Agent, or Firm* — Young & Thompson

(57) ABSTRACT

A device manufacturing method includes forming a first insulation film on a semiconductor substrate. A first mask is formed on the first insulation film to extend in a first direction and have a linear pattern. The first insulation film is etched using the first mask as mask to process the insulation film into a linear body. A second mask is formed on the linear body to extend in a second direction different from the first direction and have a linear pattern. The linear body is etched using the second mask as mask to process the linear body into a pillar element. A first conductive film is formed to cover the pillar body. The first conductive film is etched to form a first electrode of the first conductive film on side surfaces of the pillar body.

19 Claims, 20 Drawing Sheets

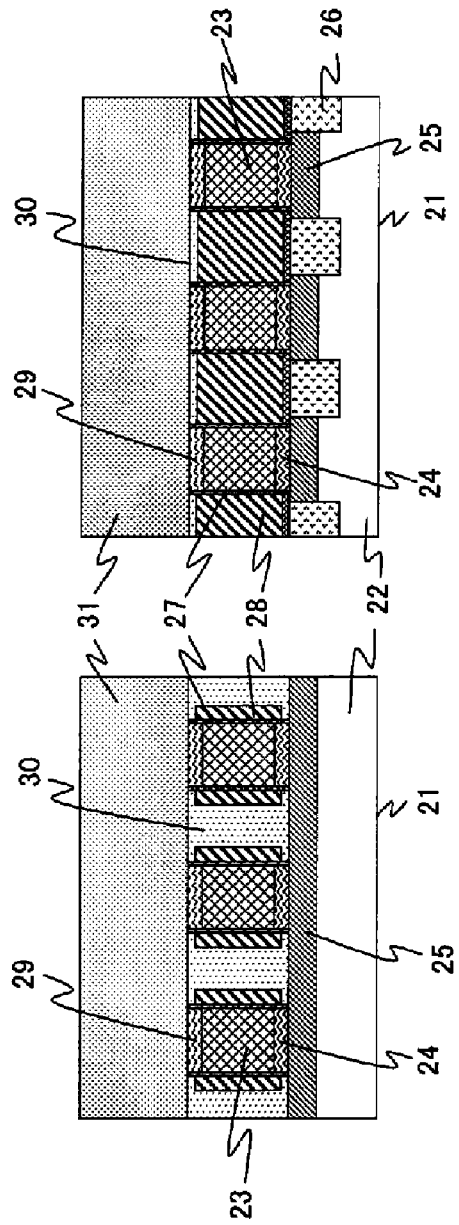
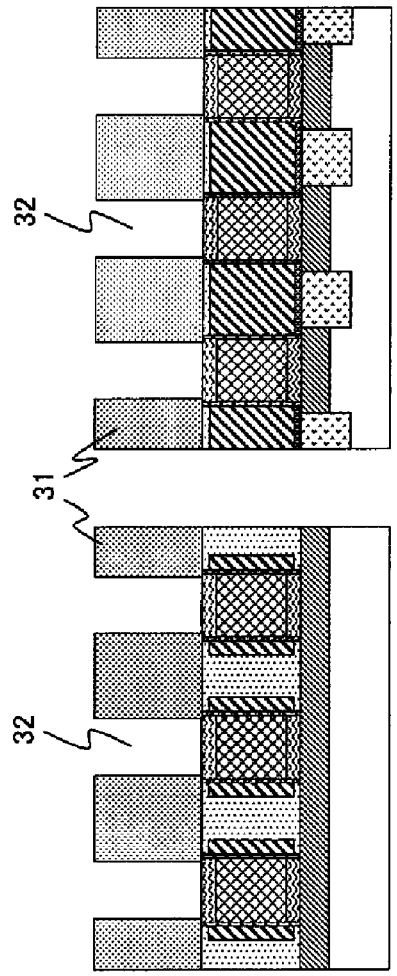

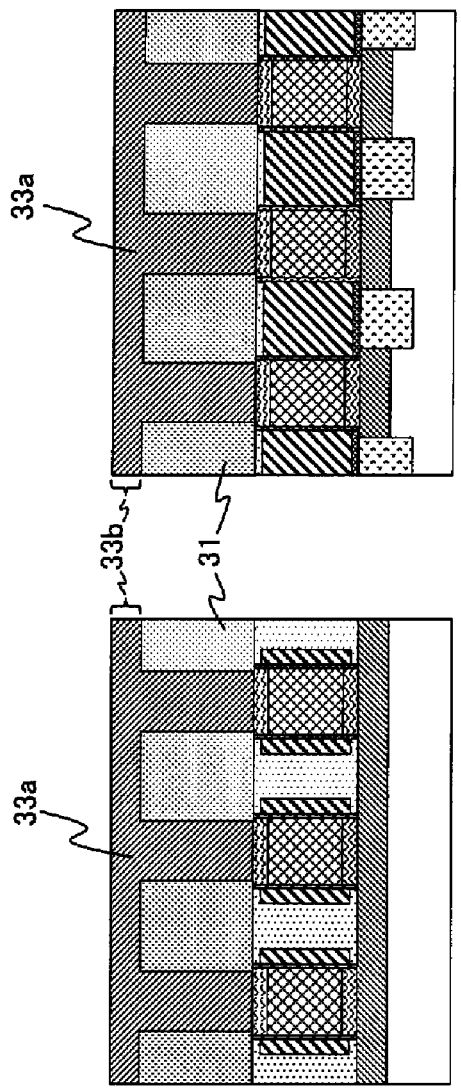
FIG. 8A
FIG. 8B
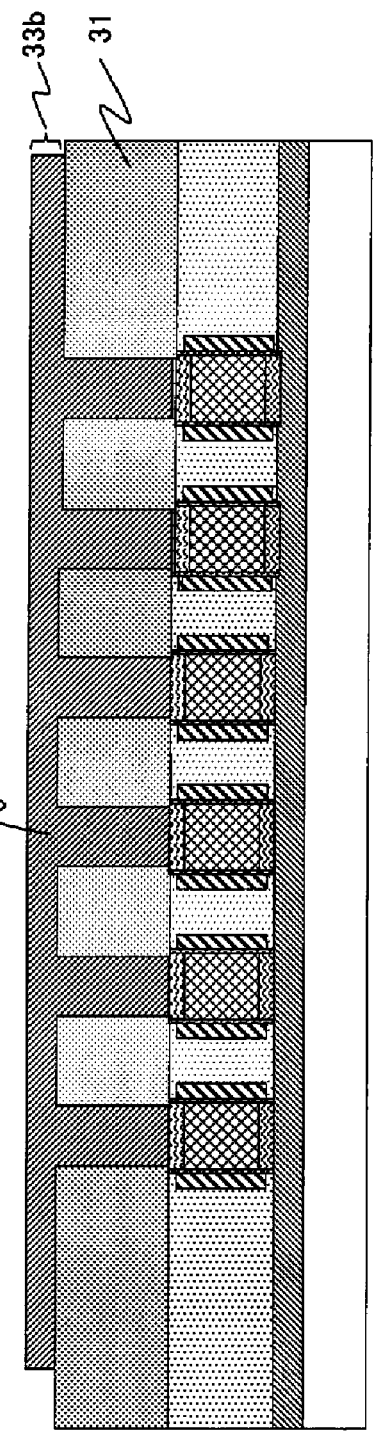
FIG. 9

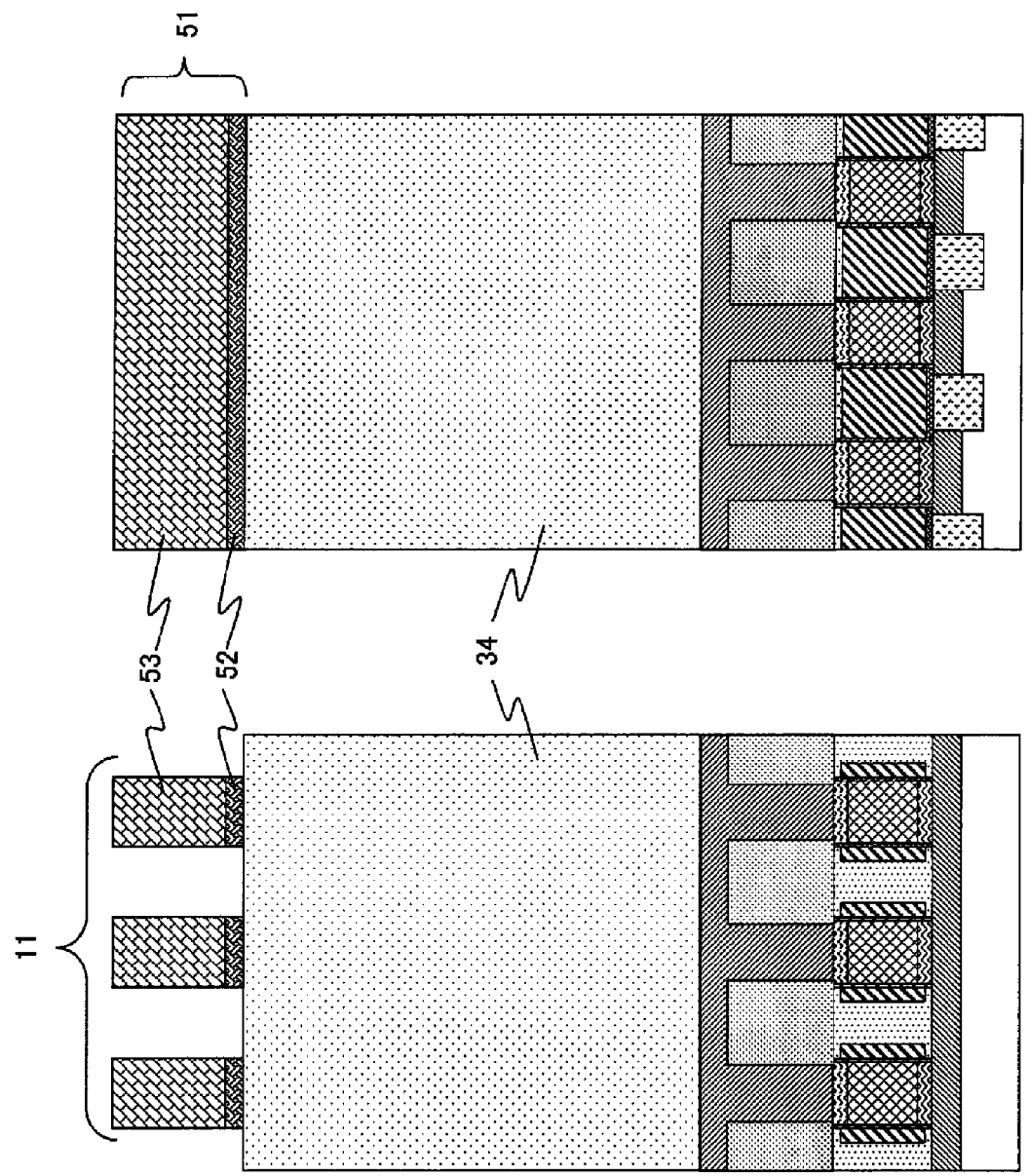

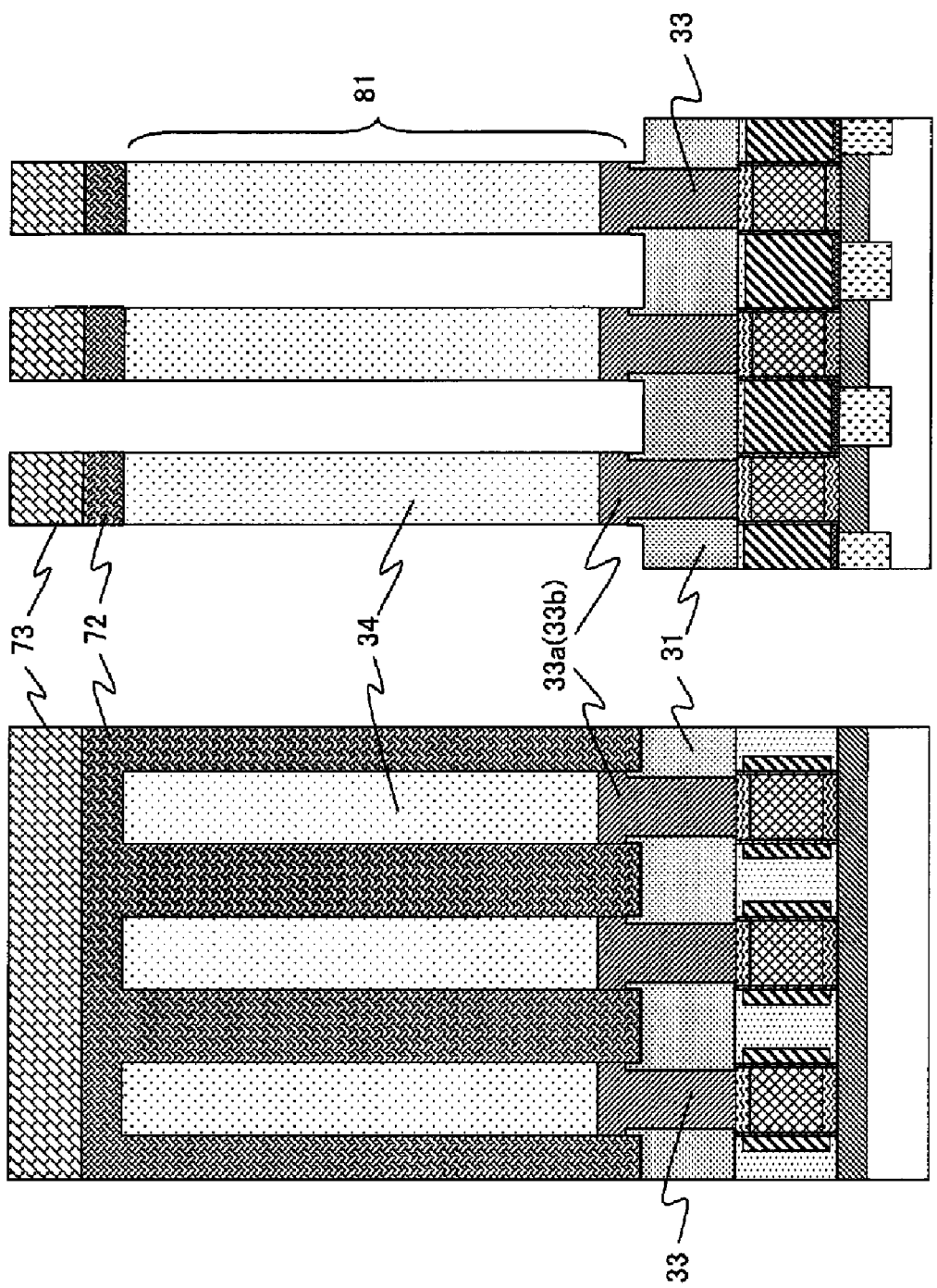

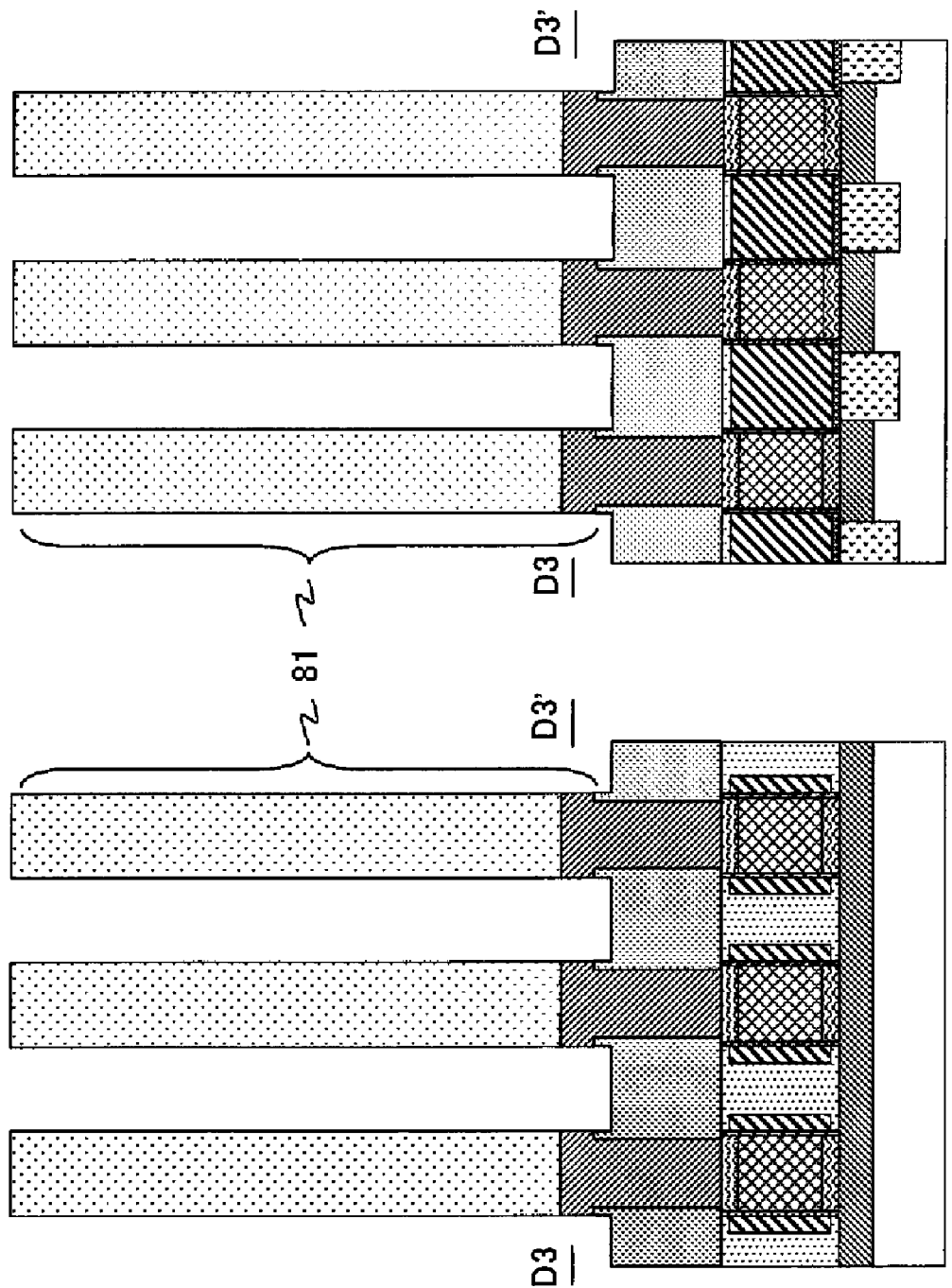

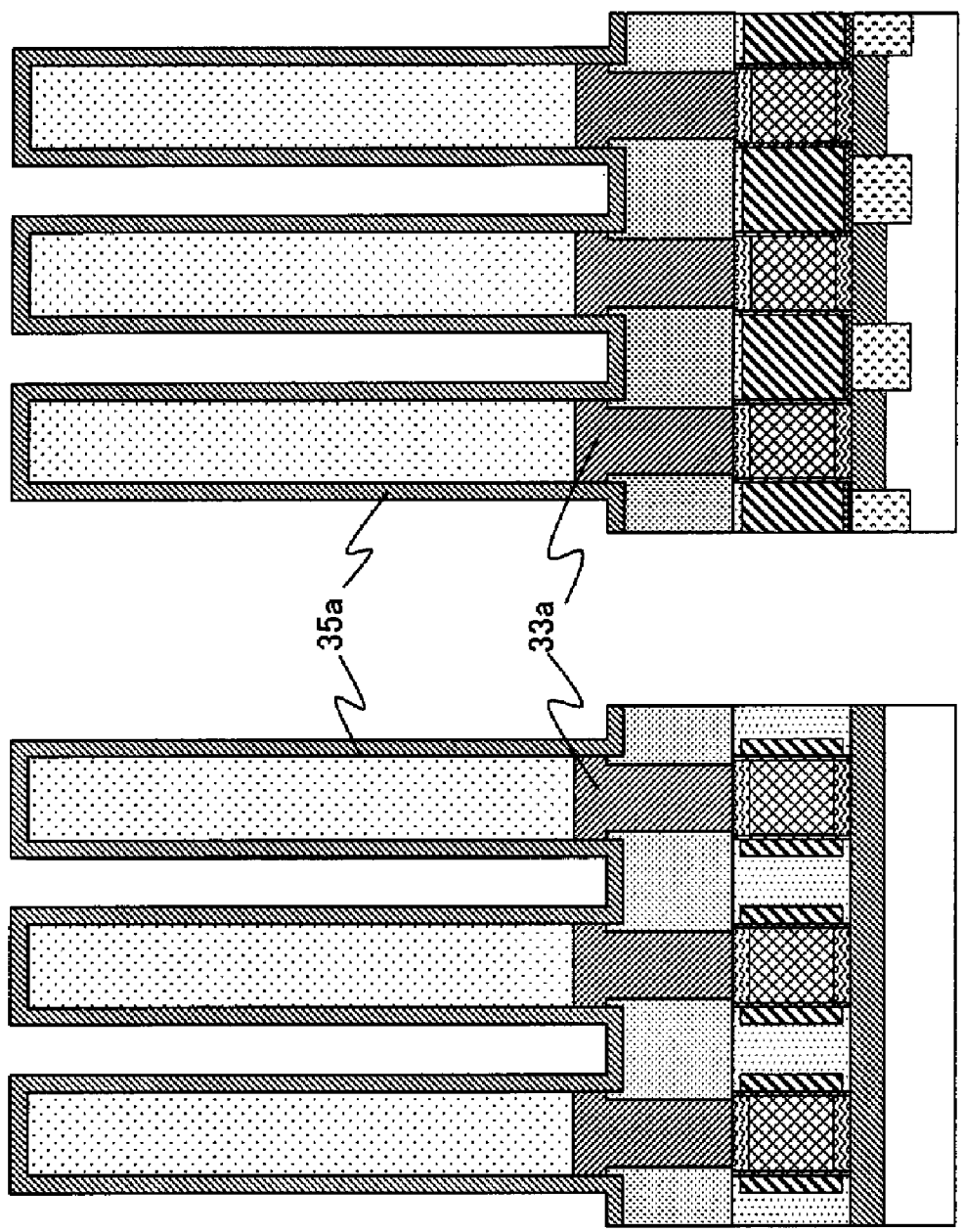

DEVICE AND MANUFACTURING METHOD THEREOF

DEVICE AND MANUFACTURING METHOD THEREOF

This application is based upon and claims the benefit of priority from Japanese patent application No. 2009-123778, filed on May 22, 2009, the disclosure of which is incorporated herein in its entirety by reference.

BACKGROUND OF THE INVENTION

1. Field of the Invention

This invention relates to a device and a manufacturing method thereof, and particularly to a semiconductor device having a three-dimensional capacitor and a manufacturing method thereof.

2. Description of the Related Art

In order to achieve further integration of semiconductor devices, it is necessary to further reduce the size of electric and electronic elements included therein. However, if a capacitor in a DRAM (Dynamic Random Access Memory) which is a type of semiconductor device is reduced in size for the purpose of reduction of the memory cell size, the capacity thereof will also be reduced, causing a problem of unstable operation. To avoid such a problem, three-dimensional capacitors have been developed as a measure to allow the capacitor to have a required capacity while reducing the area occupied by the memory cells (memory cell area). Such a capacitor is described, for example, in Japanese Laid-Open Patent Publication No. H4-25171 (Patent Document 1).

A related three-dimensional capacitor is fabricated by forming a silicon oxide film which can be formed thick relatively easily, forming a hole in the silicon oxide film, and forming a storage electrode on the inner wall of the hole. This capacitor structure is also called the concave-type capacitor structure.

Formation of a hole to form a concave-type capacitor therein is carried out, for example, by using a photolithography technique to form a hole pattern on a photoresist and dry-etching the silicon oxide film using as mask the photoresist having the hole pattern formed thereon. This type of techniques is described, for example, in Japanese Laid-Open Patent Publication No. 2000-150826 (Patent Document 2), or Japanese Laid-Open Patent Publication No. 2001-189434 (Patent Document 3).

SUMMARY

As the miniaturization of DRAMs progresses, the memory cell area is reduced, and thus the size of the capacitor top, that is, the diameter of the capacitor hole is also reduced. In order to allow the capacitor to maintain its charge storage capacity at a certain level or higher even after the size reduction of the capacitor top, the height of the capacitor, that is, the depth of the capacitor hole must be increased.

However, the inventor has found that it is difficult to form a deep capacitor hole with high accuracy. For example, when the capacitor hole is formed by dry etching, a reaction product produced during the dry etching will deposit in the formed hole, which will stop the etching process, possibly causing a problem of defective or incomplete formation of the hole. Even if the capacitor hole can be successfully formed to reach a capacitor contact plug, the hole diameter will be reduced near the bottom, possibly resulting in increase of the contact resistance between the capacitor thus formed and the capacitor contact plug.

The present invention seeks to solve one or more of the above problems, or to improve upon those problems at least in part.

In one embodiment, there is provided a device manufacturing method which comprises: forming a first insulation film on a semiconductor substrate; forming a first mask on the first insulation film, the first mask having a linear pattern and extending in a first direction; etching the first insulation film using the first mask as mask to process the first insulation film into a linear body; forming a second mask on the linear body, the second mask having a linear pattern and extending in a second direction different from the first direction; etching the linear body using the second mask as mask to process the linear body into a pillar body; forming a first conductive film to cover the pillar body; and etching the first conductive film to form a first electrode of the first conductive film on side surfaces of the pillar body.

In another embodiment, there is provided a device which comprises: a pillar body formed on a semiconductor substrate and having side surfaces consisting of two side surfaces approximately parallel in a first direction and two side surfaces approximately parallel in a second direction different from the first direction, the pillar body having a first part formed of a first insulation film; and a first electrode formed on the side surfaces, and formed of a first conductive film.

In still another embodiment, there is provided a device which comprises: a transistor having a source/drain region; a pillar body having a conductive part coupled to the source/drain region and an insulation part disposed on the conductive part, the pillar body having side surfaces consisting of two side surfaces approximately parallel in a first direction and two surfaces approximately parallel in a second direction different from the first direction; a first electrode disposed on the side surfaces of the pillar body to couple with the conductive part; a gate insulating film covering the first electrode and the pillar body; and a second electrode disposed on the gate insulating film to form a capacitor together with the first electrode.

This invention is capable of providing a three-dimensional capacitor having a greater aspect ratio.

BRIEF DESCRIPTION OF THE DRAWINGS

The above features and advantages of the present invention will be more apparent from the following description of certain preferred embodiments taken in conjunction with the accompanying drawings, in which:

FIGS. 5A and 5B are process charts for explaining a manufacturing process of the device of FIG. 3, FIG. 5A being a cross-sectional view taken along a line corresponding to the line A-A' of FIG. 2, FIG. 5B being a cross-sectional view taken along a line corresponding to the line B-B' of FIG. 2;

FIGS. 6A and 6B are process charts for explaining a process subsequent to the one shown in FIGS. 3A and 3B, FIG. 6A being a cross-sectional view taken along a line corresponding to the line A-A' of FIG. 2, FIG. 6B being a cross-sectional view taken along a line corresponding to the line B-B' of FIG. 2;

FIGS. 8A and 8B are process charts for explaining a process subsequent to the one shown in FIGS. 6A and 6B, FIG. 8A being a cross-sectional view taken along a line corresponding to the line A-A' of FIG. 2, FIG. 8B being a cross-sectional view taken along a line corresponding to the line B-B' of FIG. 2;

FIG. 9 is a process chart for explaining a process subsequent to the one shown in FIGS. 8A and 8B;

FIGS. 12A and 12B are process charts for explaining a process subsequent to the one shown in FIGS. 11A and 11B, FIG. 12A being a cross-sectional view taken along a line corresponding to the line A-A' of FIG. 2, FIG. 12B being a cross-sectional view taken along a line corresponding to the line B-B' of FIG. 2;

FIGS. 16A and 16B are process charts for explaining a process subsequent to the one shown in FIGS. 15A to 15C, FIG. 16A being a cross-sectional view taken along a line corresponding to the line A-A' of FIG. 2, FIG. 16B being a cross-sectional view taken along a line corresponding to the line B-B' of FIG. 2;

FIGS. 17A and 17B are process charts for explaining a process subsequent to the one shown in FIGS. 16A and 16B, FIG. 17A being a cross-sectional view taken along a line corresponding to the line A-A' of FIG. 2, FIG. 17B being a cross-sectional view taken along a line corresponding to the line B-B' of FIG. 2;

FIGS. 19A and 19B are process charts for explaining a process subsequent to the one shown in FIGS. 17A and 17B, FIG. 19A being a cross-sectional view taken along a line corresponding to the line A-A' of FIG. 2, FIG. 19B being a cross-sectional view taken along a line corresponding to the line B-B' of FIG. 2;

DESCRIPTION OF THE EXEMPLARY EMBODIMENTS

Before describing of the present invention, the related art will be explained in detail with reference to FIG. 1 in order to facilitate the understanding of the present invention.

Figure 1:
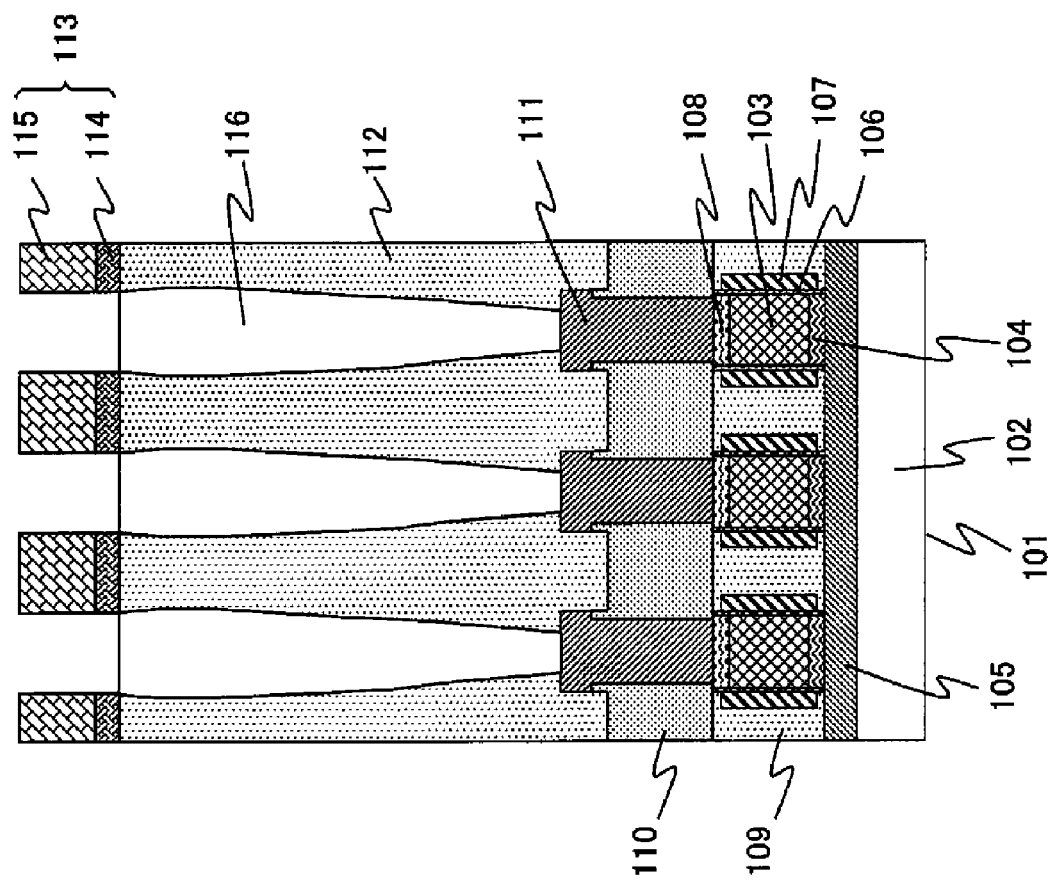
FIG. 1 is a cross-sectional view showing a state after formation of capacitor holes in a DRAM manufacturing process according to a related art.

FIG. 1 is a cross-sectional view showing a state after formation of capacitor holes in a DRAM (Dynamic Random Access Memory) manufacturing process according to a related art. FIG. 1 shows a part corresponding to three memory cells of the DRAM though a large number of memory cells are simultaneously made.

As shown in FIG. 1, there are formed, on a semiconductor substrate 101, a P-type well 102, semiconductor pillars 103, first source/drain regions 104, a bit line(s) 105, gate insulation films 106, gate electrodes 107, second source/drain regions 108, a first interlayer film 109, a second interlayer film 110, capacitor contact plugs (capacitor contact pads) 111, and a capacitor interlayer film 112. There are formed, on the capacitor interlayer film 112, an antireflection film 114 and a resist film 115 as a mask material 113. A pattern for forming capacitor holes is formed in the mask material 113. Capacitor holes 116 are formed in the capacitor interlayer film 112 by performing dry etching using the mask material 113 as mask. The top surfaces of the capacitor contact plugs 111 are exposed at the bottoms of the capacitor holes 116.

Along with the progress of miniaturization of DRAMs, the area of a memory cell is reduced, and the size of a capacitor top, i.e., the diameter of the capacitor hole 116 is also reduced. In order to allow the capacitor to maintain its charge storage capacity at a certain level or higher even if the capacitor top size is reduced, the height of the capacitor, i.e., the depth of the capacitor hole 116 must be increased.

However, when the capacitor hole 116 is formed by dry etching, for example, a reaction product produced during the dry etching will be deposited in the hole, which will stop the etching, possibly causing a problem of defective or incomplete formation of the hole. Even if the capacitor hole 116 can be formed successfully to reach the capacitor contact plug 111, the diameter of the hole will be reduced near the bottom, and the contact resistance between the capacitor thus formed and the capacitor contact plug 111 may be increased.

Hereinafter, exemplary embodiments of this invention will be described in detail with reference to the attached drawings.

Figure 2:
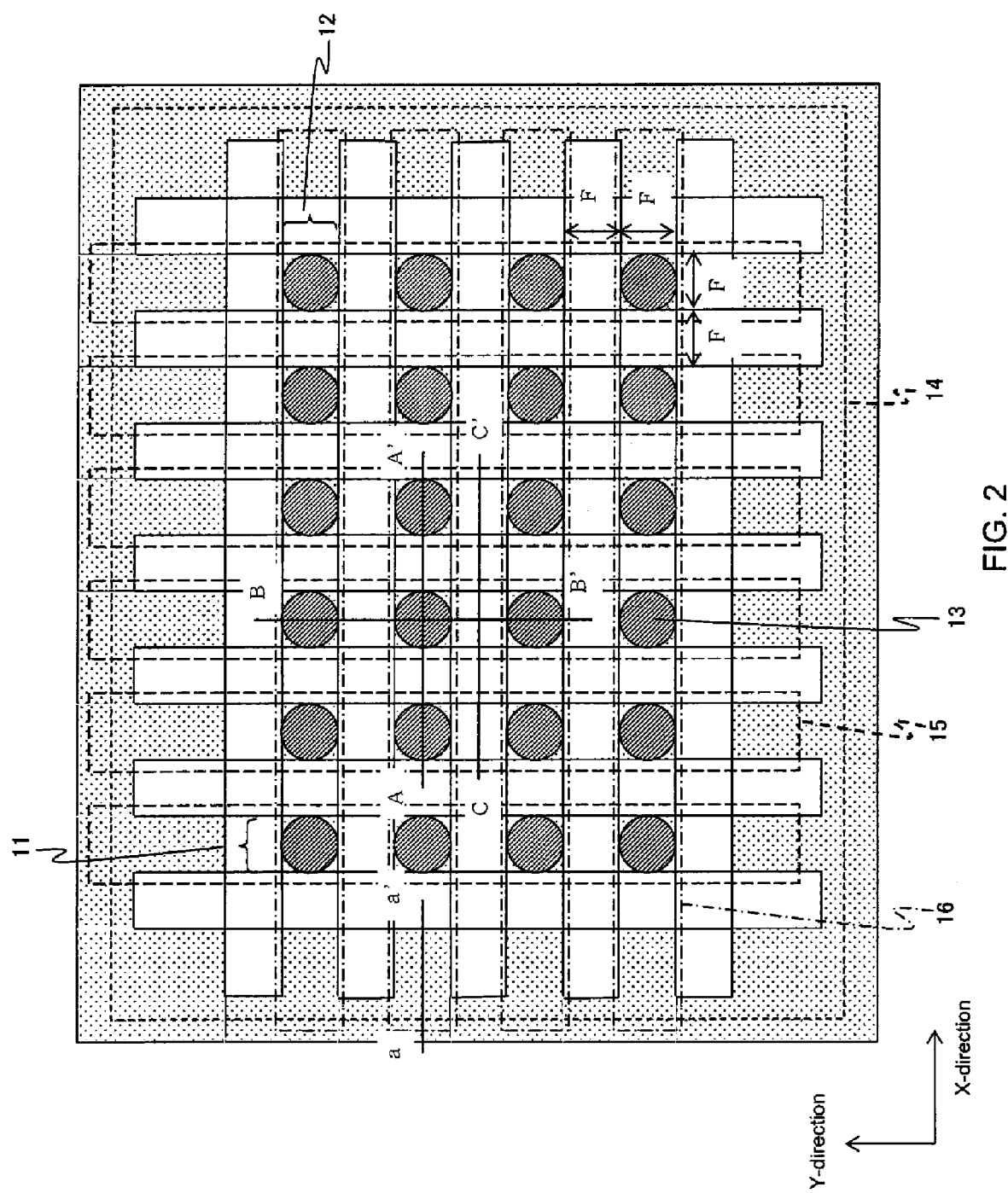
FIG. 2 is a plan view showing a plurality of mask patterns overlapped with each other for use in manufacture of a device according to a first embodiment of this invention.

FIG. 2 is a diagram showing a plurality of mask patterns for use in manufacture of a device according to a first embodiment of the invention, the mask patterns being overlapped with each other. It is assumed here that the device is a DRAM which is a type of semiconductor device. Though the mask patterns of FIG. 2 is for 6×4 memory cells, the invention is not limited to the arrangement of memory cells.

The structure of memory cell array of the DRAM can be seen from FIG. 2. In the example shown in FIG. 2, each unit memory cell has vertical and horizontal sides of the same length of 2F, and thus it has a memory cell area of $4F^2$. It is assumed that F represents a minimum processing dimension in mask formation using a lithography technique, and F is equal to 50 nm, for example.

The mask patterns shown in FIG. 2 are, more particularly, composed of a first capacitor pattern 11, a second capacitor pattern 12, capacitor contact patterns 13, a capacitor contact pad pattern 14, a word line pattern 15, and a bit line pattern 16.

The first capacitor pattern 11 and the second capacitor pattern 12 both have rectangular parts (linear patterns) with a width of F. The rectangular parts of the first capacitor pattern 11 extend in a Y-direction (first direction), and arranged at a pitch of 2F along an X-direction (second direction) which is different from the Y-direction. The rectangular parts of the second capacitor pattern 12 extend in the X-direction and arranged at a pitch of 2F along the Y-direction.

Each of the capacitor contact patterns 13 is located in the square region where the rectangular part of the first capacitor pattern 11 intersects with the rectangular part of the second capacitor pattern 12. Although the capacitor contact patterns 13 are represented by circles in FIG. 2, they may be of a rectangular shape.

The capacitor contact pad pattern 14 is formed to cover the memory cell array region.

Figure 3:
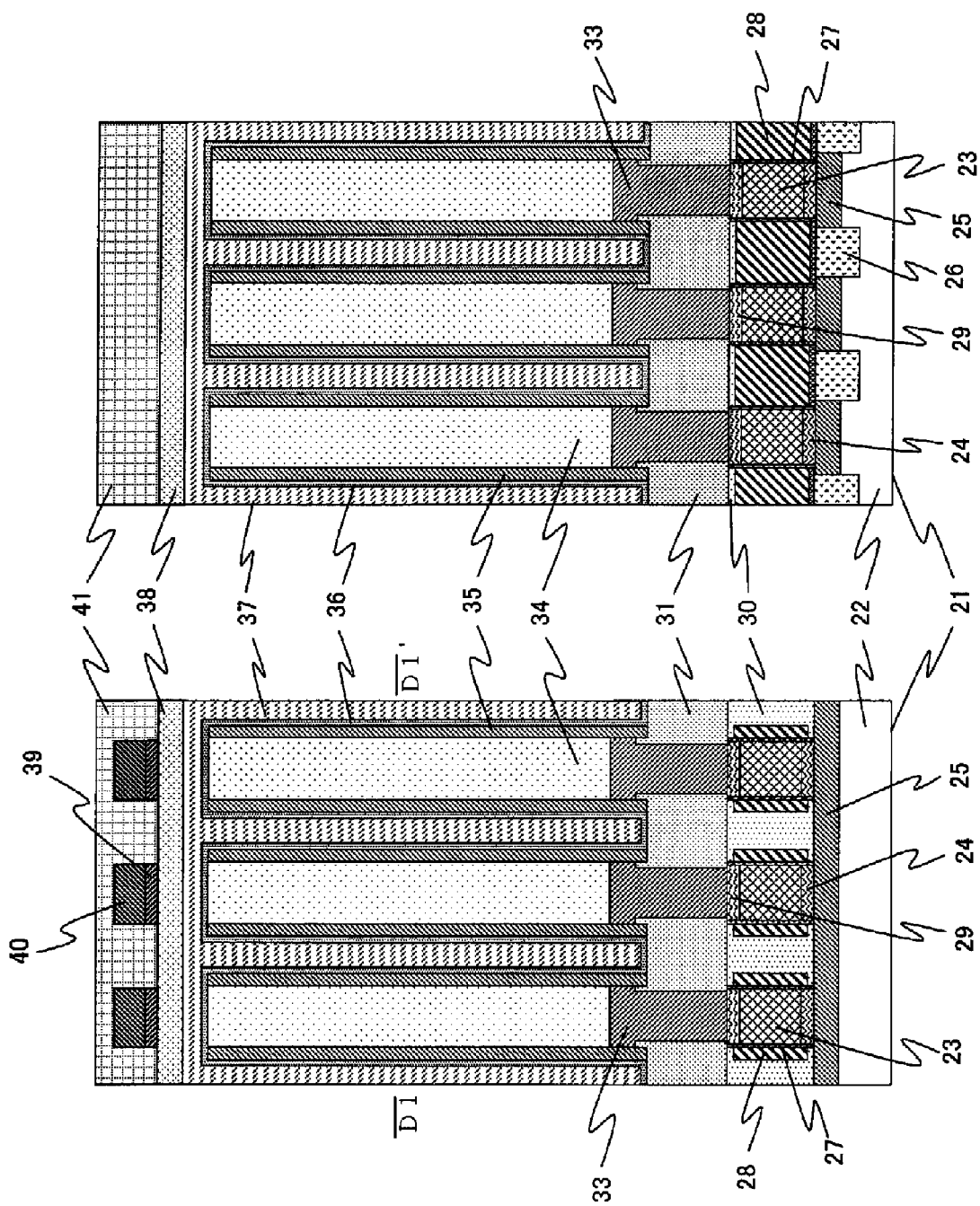
FIGS. 3A and 3B are cross-sectional views showing a configuration example of the device according to the first embodiment of the invention, FIG. 3A being a cross-sectional view taken along a line corresponding to the line A-A' of FIG. 2, FIG. 3B being a cross-sectional view taken along a line corresponding to the line B-B' of FIG. 2.
Figure 4:
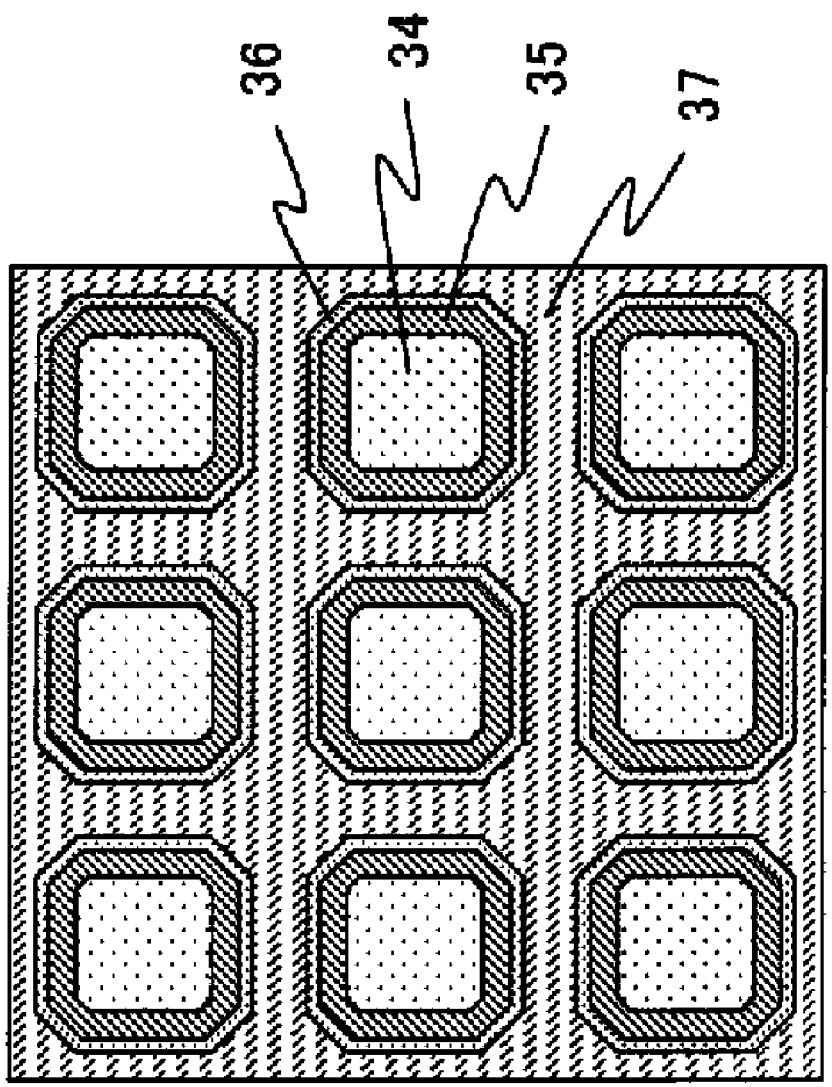
FIG. 4 is a cross-sectional view taken along the line D1-D1' of FIG. 3.

Referring to FIGS. 3A and 3B and FIG. 4, a configuration of a device (DRAM) according to the first embodiment of the invention will be described.

FIGS. 3A and 3B are longitudinal cross-sectional views of a DRAM according to the embodiment of the invention, taken along lines corresponding to the line A-A' and the line B-B' in FIG. 2, respectively.

The DRAM shown in FIGS. 3A and 3B has a semiconductor substrate 21 in which there are formed a P-type well 22, semiconductor pillars 23, first source/drain regions 24, bit lines 25, element isolation regions 26, gate insulation films 27, gate electrodes 28, second source/drain regions 29, a first interlayer film 30, a second interlayer film 31, capacitor contact plugs 33, a capacitor interlayer film 34, storage electrodes (lower electrodes) 35, a capacitor insulation film 36, an upper electrode 37, a third interlayer film 38, barrier metals 39, Al—Cu wiring lines 40, and a fourth interlayer film 41.

FIG. 4 is a cross-sectional view taken along the line D1-D1' in FIG. 3A. FIG. 4 shows a part corresponding to nine memory cells (or capacitors).

As seen from FIGS. 3A and 3B and FIG. 4, the capacitor interlayer film 34 serving as a (first) insulation film forms a shape of pillars each having a substantially square cross-sectional shape with two opposite parallel sides in the X- or Y-direction. The pillar bodies have a width of F in both the X- and Y-directions, and are spaced from each other by a distance (interval) of F. The corners of the cross-sectional of the pillar bodies are not square but rounded, due to the effect produced during formation of the pillar bodies or during subsequent wet cleaning processing or the like.

As is understood from FIG. 4, the storage electrode (first electrode) 35 is formed of a first conductive film so as to surround (cover) the periphery of each pillar body of the capacitor interlayer film 34. The capacitor insulation film (second insulation film) 36 is formed around the storage electrodes 35 to cover the storage electrodes 35. Further, the upper electrode (second electrode formed of a third conductive film) 37 is formed around the capacitor insulation film 36.

Referring to FIGS. 5A and 5B through FIGS. 22A and 22B, a manufacturing method of the DRAM according to the first embodiment of the invention will be described. FIGS. 5A, 6A, 8A, 11A, 12A, 13A, 15A, 16A, 17A, 19A, 20A, 21A and 22A are cross-sectional views taken along a line corresponding to the line A-A' of FIG. 2. FIGS. 5B, 6B, 8B, 11B, 12B, 13B, 15B, 16B, 17B, 19B, 20B, 21B and 22B are cross-sectional views taken along a line corresponding to the line B-B' of FIG. 2. FIG. 15C is a cross-sectional view taken along a line corresponding to the line C-C' of FIG. 2. It is assumed that the X- and Y-directions as used in the following description are the same as the X- and Y-directions in FIG. 2.

As shown in FIGS. 5A and 5B, vertical transistors are formed on a P-type well 22 formed in a semiconductor substrate 21, and a first interlayer film 30 and a second interlayer film 31 are formed. The vertical transistors are fabricated in the following manner.

First, the P-type well 22 is formed in the semiconductor substrate 21. It is assumed here that an NMOS (N-channel Metal Oxide Semiconductor) transistor is used as a memory cell transistor. The semiconductor substrate 21 may be, for example, a silicon substrate or a germanium substrate.

Next, semiconductor pillars 23, or pillar portions are formed on the P-type well 22. The semiconductor pillars 23 are arranged at a pitch of 2F in the X- and Y-directions. The semiconductor pillars 23 are formed at the positions corresponding to those of the capacitor contact patterns 13 (see FIG. 2).

Next, first source/drain regions 24 of the transistors are formed under the semiconductor pillars 23, respectively, by ion implantation or impurity diffusion from an impurity-containing film. With the similar means, bit lines 25 are formed under the semiconductor pillars 23. The bit lines 25 extend in the X-direction. Each of the bit lines 25 couples the first source/drain regions 24 arranged in the X direction. When the memory cell transistor is an NMOS transistor, the first source/drain region 24 and the bit line 25 are both formed as a diffusion layer containing an N-type impurity.

Next, element isolation regions 26 are formed to isolate the bit lines 25 from each other. The element isolation regions 26 are formed for example by a STI (Shallow Trench Isolation) technique using a silicon oxide film. Alternatively, the element isolation regions 26 may be provided by formation of P-type diffusion regions.

Subsequently a gate insulation film 27 is formed on the side surfaces of the semiconductor pillar 23, and then a doped polysilicon film is formed to provide the gate electrodes 28. The doped polysilicon film is then etched to form word lines surrounding the semiconductor pillars 23 and extending in the Y-direction. Further, a second source/drain region 29 is formed on top of each of the semiconductor pillars 23 by ion implantation.

The vertical transistors are formed on the semiconductor substrate 21 by the process steps described above. Processes similar to that described above are disclosed in the above-mentioned Patent Document 1 and other documents.

After that, a first interlayer film 30 is formed to fill the spaces between the gate electrodes 28, and then a second interlayer film 31 is formed on the semiconductor pillars 23 and the first interlayer film 30. Thus, a structure as shown in FIGS. 5A and 5B is obtained.

Next, as shown in FIGS. 6A and 6B, capacitor contact holes 32 are formed in the second interlayer film 31 by using a lithography technique and a dry etching technique. The capacitor contact holes 32 have a diameter of about F.

Figure 7:
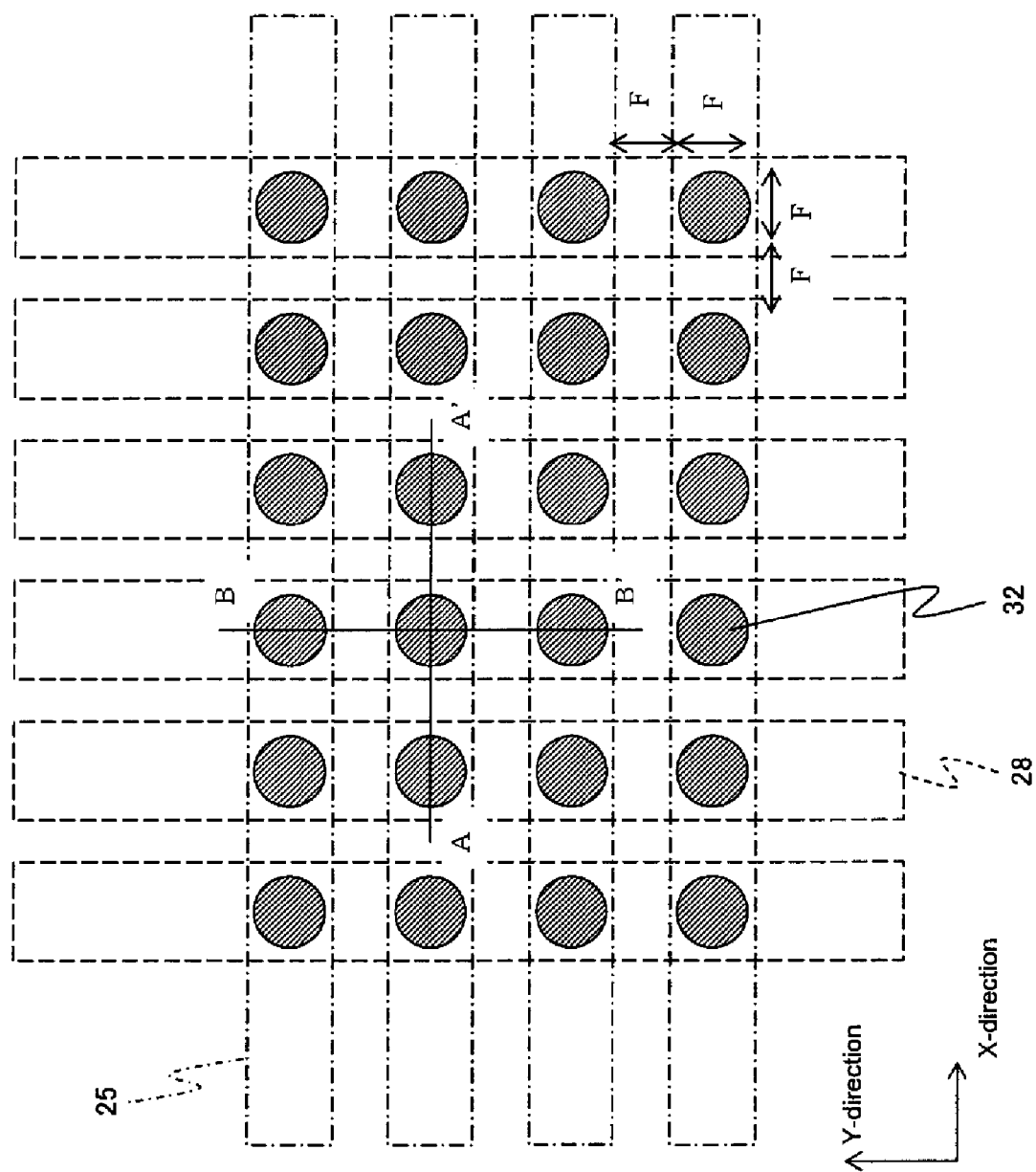
FIG. 7 is a plan view for explaining a positional relationship between capacitor contact holes and word and bit lines after the process shown in FIGS. 6A and 6B.

FIG. 7 shows the positional relationship among the word lines (gate electrodes 28), the bit lines 25, and the capacitor contact holes 32 formed by the processes described above.

Next, as shown in FIGS. 8A and 8B, the capacitor contact holes 32 are filled and a capacitor contact conductive film (second conductive film) 33a is formed to cover the second interlayer film 31. In other words, the capacitor contact conductive film 33a is formed to extend from an inside of each capacitor contact hole 32 to an upper surface of the second interlayer film 31. The capacitor contact conductive film 33a functions as capacitor contact plugs 33 in the capacitor contact holes 32. The other part of the capacitor contact conductive film 33a than the part which forms the capacitor contact plugs 33 shall herein be called a capacitor contact pad 33b. The capacitor contact conductive film 33a may be formed by successively stacking a Ti film, a TiN film and a W film, for example. In this case, the Ti film, the TiN film, and the W film may be formed, for example, to have thicknesses of 5 nm, 5 nm, and 50 nm, respectively. Alternatively, the capacitor contact conductive film 33a may be formed by an impurity doped silicon film or a single layer of TiN film.

Figure 10:
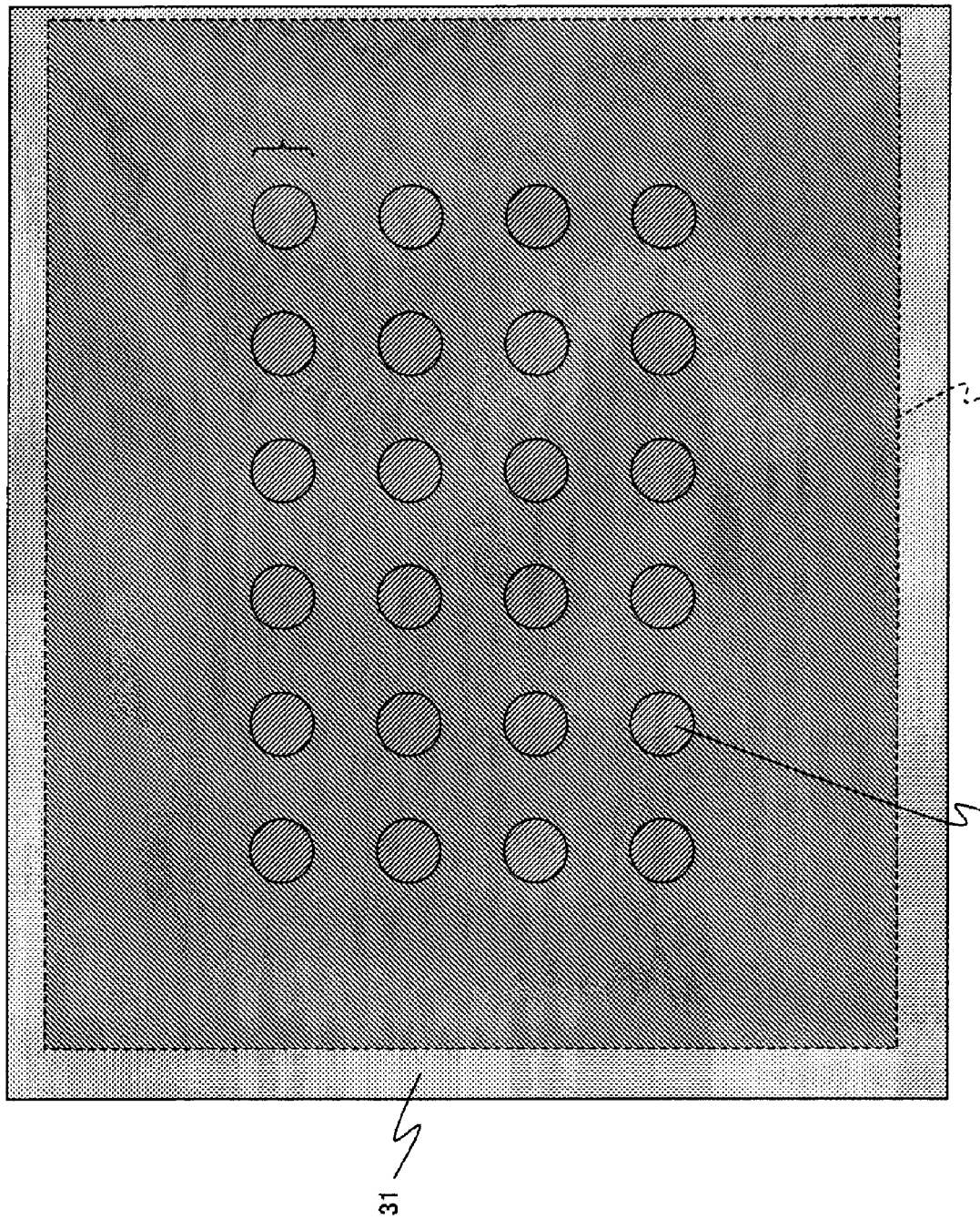
FIG. 10 is a plan view of the state shown in FIG. 9.

The capacitor contact conductive film 33a is then processed by using lithography and dry etching techniques into a capacitor contact pad pattern 14 (see FIG. 2) as shown in FIGS. 9 and 10, whereby a capacitor contact pad 33b covering the memory cell region is obtained.

Figures 11A, 11B:
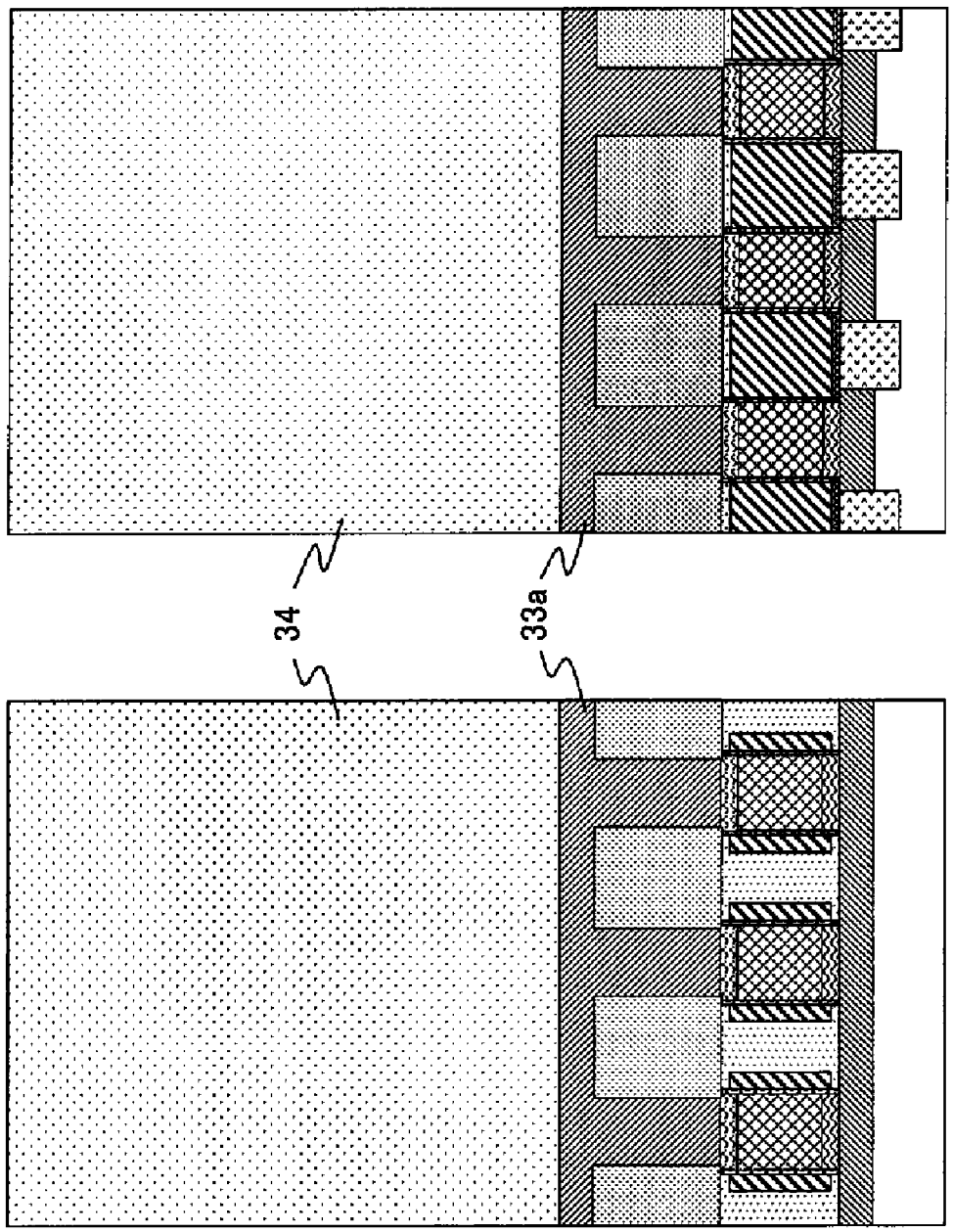
FIGS. 11A and 11B are process charts for explaining a process subsequent to the one shown in FIG. 9, FIG. 11A being a cross-sectional view taken along a line corresponding to the line A-A' of FIG. 2, FIG. 11B being a cross-sectional view taken along a line corresponding to the line B-B' of FIG. 2.

Next, as shown in FIGS. 11A and 11B, a capacitor interlayer film 34 is formed on the capacitor contact conductive film 33a. The capacitor interlayer film 34 may be a silicon oxide film formed by a CVD method. Alternatively, the capacitor interlayer film 34 may be formed of a BPSG film, a SOG film or other insulation film. The capacitor interlayer film 34 may be of a thickness of 1 μm, for example.

Next, as shown in FIGS. 12A and 12B, a mask material (first mask) 51 is formed on the capacitor interlayer film 34 to form patterns by photolithography.

The mask material 51 may be formed by stacking an antireflection film 52 and a photoresist film 53. It may be formed by a single layer of photoresist film 53 when exposure light reflected by the underlying surface does not pose any problem.

After the successive formation of the antireflection film 52 and the photoresist film 53, the photoresist film 53 is processed using a photolithography technique to form first capacitor patterns 11 (see FIG. 2). These patterns have a width of F and are spaced apart from each other by a distance of F.

The first capacitor patterns 11 are line-and-space patterns (LS patterns) in which line patterns extending in the Y-direction are repeatedly arranged at the same pitch along the X-direction. The LS patterns are superior to hole patterns or the like in terms of exposure resolution, and thus enable formation of finer patterns and use of a photoresist film of a greater thickness. In the present invention, the use of a photoresist film of a greater thickness enables dry etching processing of a capacitor interlayer film 34 of a greater thickness, which makes it possible to increase the capacity of a resulting capacitor. Further, the use of a photoresist film of a greater thickness makes it possible to increase the overetching amount during etching of the capacitor interlayer film 34 (the process shown in FIGS. 13A and 13B to be described later), providing advantageous effects such as improvement of etching performance.

The photoresist film 53 which has been processed to have the first capacitor patterns 11 includes a plurality of linear line patterns covering the capacitor contact plugs 33 arranged in the Y-direction, these line patterns being arranged at predetermined intervals along the X-direction. In terms of the X-direction, the regions where no capacitor contact plugs 33 are formed are utilized as the regions to be etched away.

Next, the antireflection film 52 is etched by a dry etching technique using the photoresist film 53 as mask, whereby first capacitor patterns 11 are formed. As a result, the patterned mask material 51 as shown in FIGS. 12A and 12B is obtained.

Figures 13A, 13B:
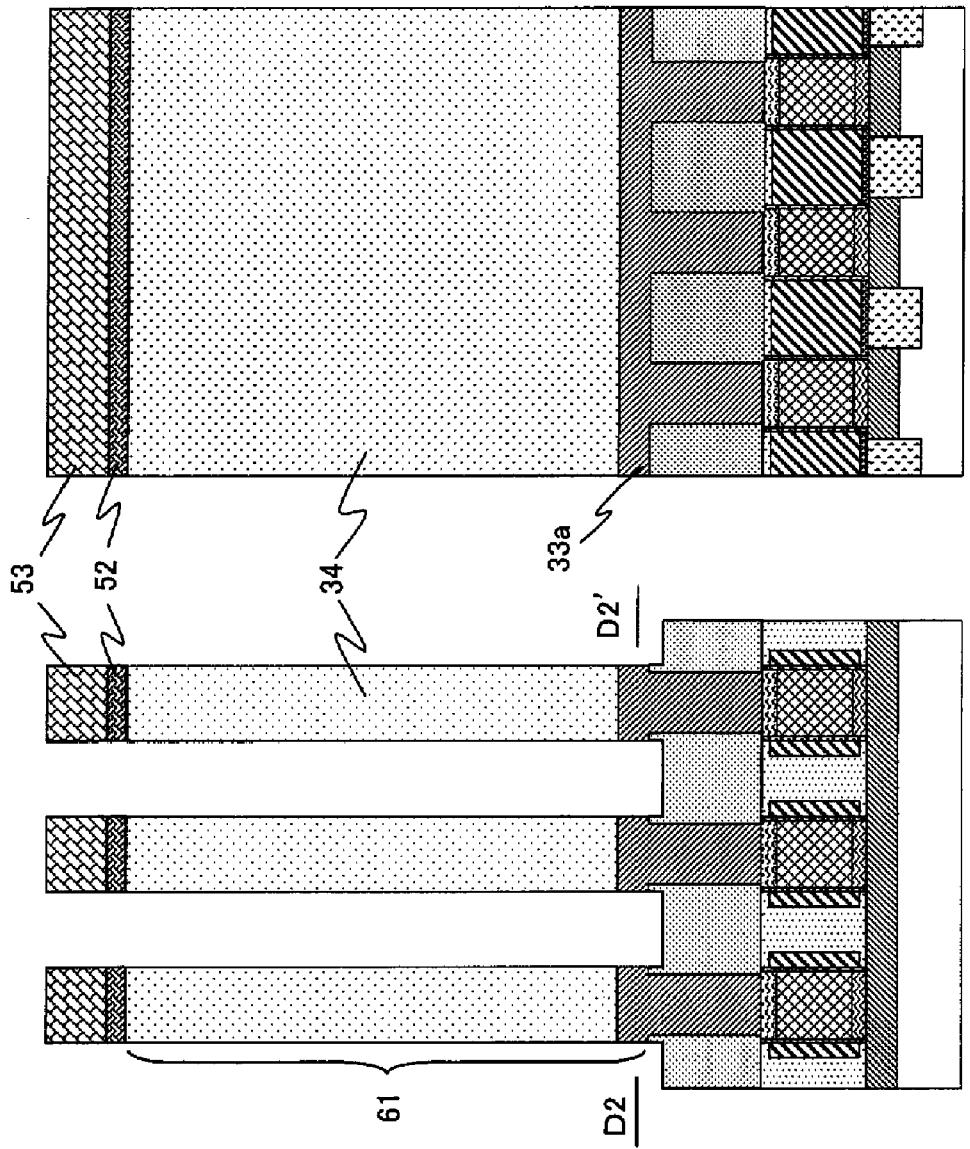
FIGS. 13A and 13B are process charts for explaining a process subsequent to the one shown in FIGS. 12A and 12B, FIG. 13A being a cross-sectional view taken along a line corresponding to the line A-A' of FIG. 2, FIG. 13B being a cross-sectional view taken along a line corresponding to the line B-B' of FIG. 2.

Next, as shown in FIGS. 13A and 13B, the capacitor interlayer film 34 and the capacitor contact conductive film 33a are etched using the patterned photoresist film 53 and antireflection film 52 as mask. In other words, (a first part of) the capacitor contact conductive film 33a is etched continuously after the capacitor interlayer film 34 is etched. This provides stacked capacitor bodies (linear capacitor bodies) 61 each composed of the capacitor interlayer film 34 and the capacitor contact conductive film 33a and extending in the Y-direction. The capacitor contact conductive film 33a is etched until the top surface of the second interlayer film 31 is exposed and partially etched away. In other words, (a first part of) the second interlayer film 31 is etched continuously after the first part of the capacitor contact conductive film 33a. Hereby, the shape of the capacitor contact conductive film 33a is determined in a self-aligned manner with the capacitor interlayer film 34 by which the capacitors are formed.

Figure 14:
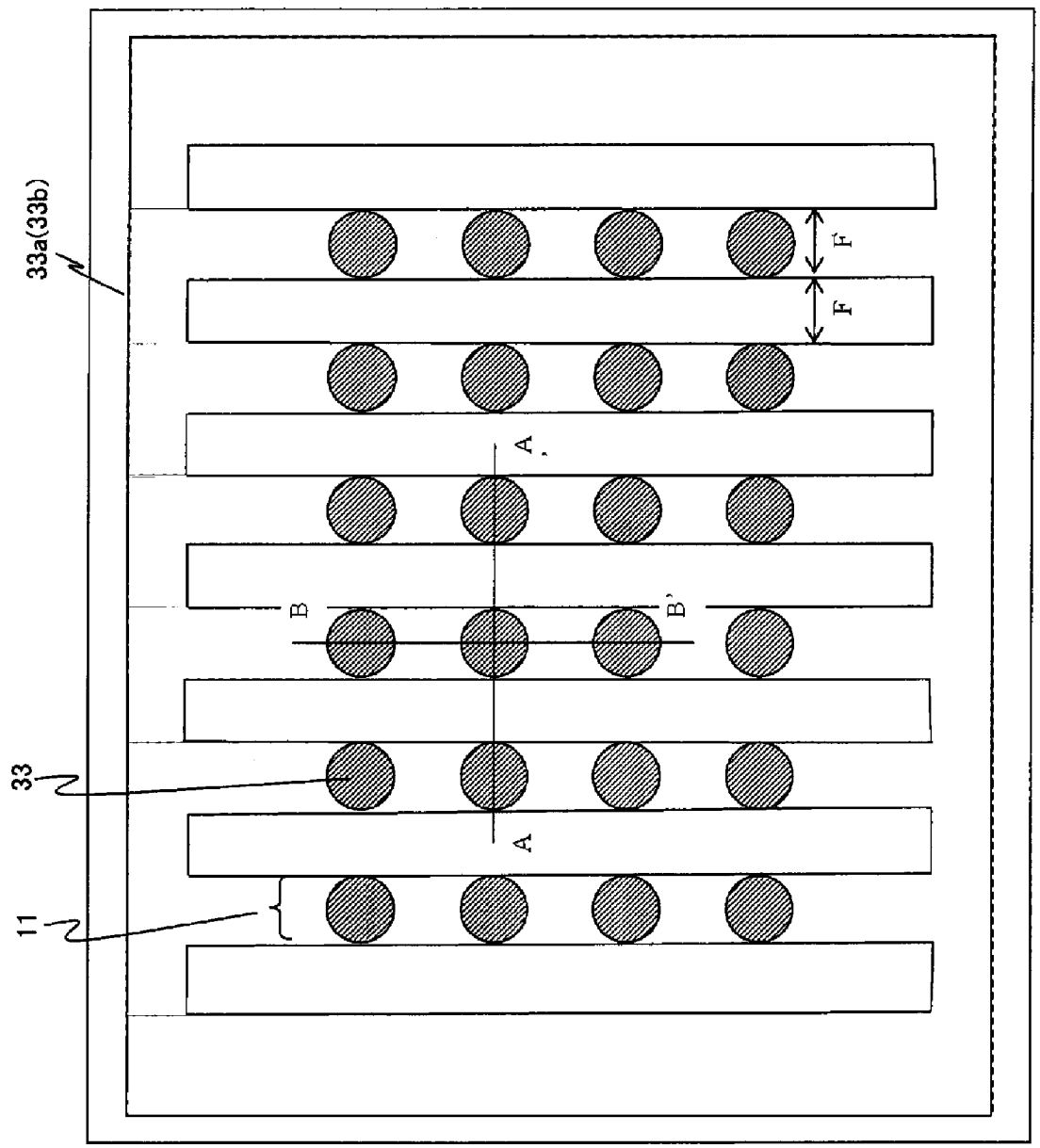
FIG. 14 is a cross-sectional view taken along a line corresponding to the line D2-D2' of FIG. 13A.
Figures 15A, 15B, 15C:
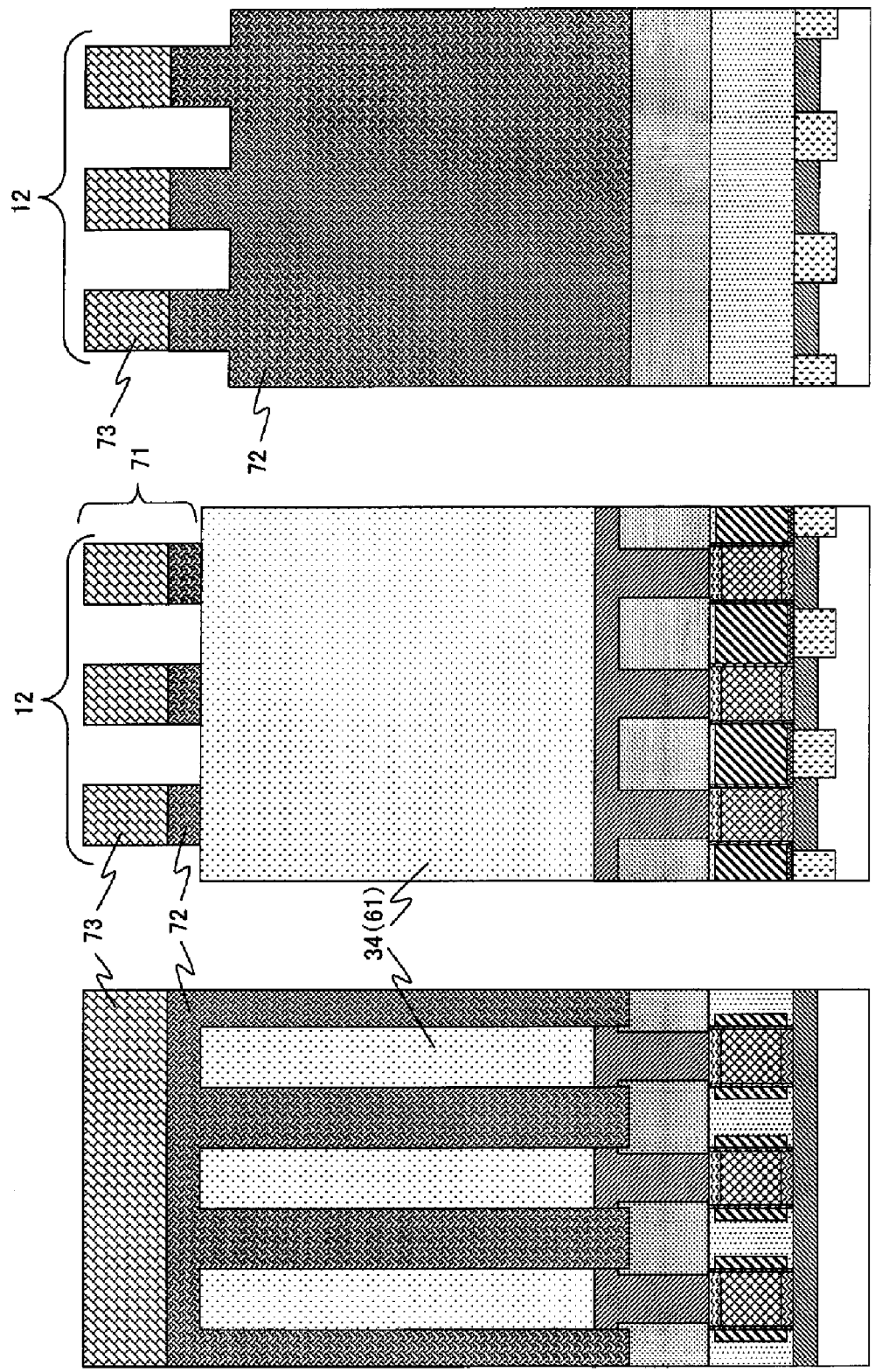
FIGS. 15A to 15C are process charts for explaining a process subsequent to the one shown in FIGS. 13A and 13B, FIG. 15A being a cross-sectional view taken along a line corresponding to the line A-A' of FIG. 2, FIG. 15B being a cross-sectional view taken along a line corresponding to the line B-B' of FIG. 2, FIG. 15C being a cross-sectional view taken along a line corresponding to the line C-C' of FIG. 2.

FIG. 14 is a cross-sectional view taken along the plane corresponding to the line D2-D2' of FIG. 13A, and shows a planar shape of the capacitor contact conductive film 33a (or capacitor contact pads 33b). The capacitor contact conductive film 33a is processed to mutually connect the capacitor contact plugs 33 arranged in the Y-direction and to isolate the capacitor contact plugs 33 arranged in the X-direction.

The patterns of the mask material 51 used in the dry etching for forming the stacked first capacitor pattern bodies 61 are LS patterns. Therefore, the etching ions are allowed to reach the object to be etched more easily than when the patterns are hole patterns, enabling etching at a high aspect ratio. Further, the resulting reaction product is easy to be discharged, reducing the chances of causing problems such as etching stop. As a result, finer patterns can be formed by the etching and the capacitor interlayer film can be etched deeper. Since the capacitor interlayer film can be etched deeper, a capacitor interlayer film of a greater thickness can be used to increase the capacitance of the capacitor.

After that, the photoresist film 53 and the antireflection film 52 are removed.

Next, as shown in FIGS. 15A, 15B and 15C, a mask material (second mask) 71 is formed to pattern the stacked capacitor bodies 61 by photolithography.

In the same manner as the mask material 51, the mask material 71 may be formed by stacking an antireflection film 72 and a photoresist film 73. The antireflection film 72 is formed to bury the stacked capacitor bodies 61 and such that the top surface thereof is flat. The photoresist film 73 is formed on the flat top surface of the antireflection film 72. The mask material 71 may be formed by a single layer of photoresist film 73 when exposure light reflected by the underlying surface does not pose any problem.

After successive formation of the antireflection film 72 and the photoresist film 73, these films are processed to be provided with second capacitor patterns 12 (see FIG. 2).

Specifically, the photoresist film 73 is patterned by using a photolithography technique to be provided with the second capacitor patterns 12. The second capacitor patterns 12 are LS patterns having a width of F and spaced from each other by a distance of F. As described above, the LS patterns enable processing of a shape at a higher aspect ratio than the hole patterns do.

Subsequently, the antireflection film 72 is etched by a dry etching technique using the photoresist film 73 as mask. This etching process is carried out such that the top of the capacitor interlayer film 34 constituting the upper part of the stacked capacitor bodies 61 is exposed but the surface of the second interlayer film 31 that has been exposed during the formation of the stacked capacitor bodies 61 is still covered with the antireflection film 72 and not exposed.

Thus, the mask material 71 having the second capacitor patterns 12 is formed as shown in FIGS. 15A, 15B and 15C. The mask material 71 having the second capacitor patterns 12 includes a plurality of linear line patterns covering capacitor contact plugs arranged in the X-direction, these line patterns being arranged at predetermined intervals along the Y-direction. In terms of the Y-direction, the regions where no capacitor contact plug is formed are utilized as the regions to be etched away.

Next, as shown in FIGS. 16A and 16B, the capacitor interlayer film 34 and the capacitor contact conductive film 33a are dry-etched using the antireflection film 72 and the photoresist film 73 as mask. In other words, (a second part of) the capacitor contact conductive film 33a is etched continuously after the capacitor interlayer film 34 is etched. The etching of the capacitor contact conductive film 33a is carried out until the top of the second interlayer film 31 is exposed and partially etched away. In other words, (a second part of) the second interlayer film 31 is etched continuously after the second part of the capacitor contact conductive film 33a. Hereby, the shape of the capacitor contact conductive film 33a is determined in a self-aligned manner with the capacitor interlayer film 34 by which the capacitors are formed.

By the processes as described above, stacked capacitor bodies (pillar capacitor bodies) 81 each composed of the capacitor interlayer film 34 and the capacitor contact conductive film 33 are obtained. In each capacitor body, the capacitor interlayer film 34 and the capacitor contact conductive film 33 are corresponding to an insulation part and a conductive part, respectively, of the pillar body. Ideally, the stacked capacitor bodies 81 are of a pillar shape with a rectangular planar shape (square shape with a side length of F), i.e., of a rectangular parallelepiped shape. In practice, however, the stacked capacitor bodies 81 have a substantially square planar shape the corners of which are rounded.

The capacitor contact pad 33b mutually connecting the capacitor contact plug 33 arranged in the Y-direction is separated in the Y-direction so that the separated capacitor contact pads correspond to the respective capacitor contact plugs 33.

The patterns of the photoresist film 73 used in the dry etching for forming the stacked capacitor bodies 81 are LS patterns. Therefore, the etching ions are allowed to reach the object to be etched more easily than when the patterns are hole patterns, enabling etching at a higher aspect ratio. Further, the resulting reaction product is easy to be discharged, reducing the chances of causing problems such as etching stop.

In the process of etching the antireflection film 72 (FIGS. 15A to 15C), the level of the exposed top surface of the antireflection film 72 is set to a lower level while the side surfaces along the Y-direction of the stacked capacitor bodies 61 are exposed over an wider area, whereby the dry etching can be facilitated to form the stacked capacitor bodies 81.

Next, as shown in FIGS. 17A and 17B, the photoresist film 73 and the antireflection film 72 are removed.

Figure 18:
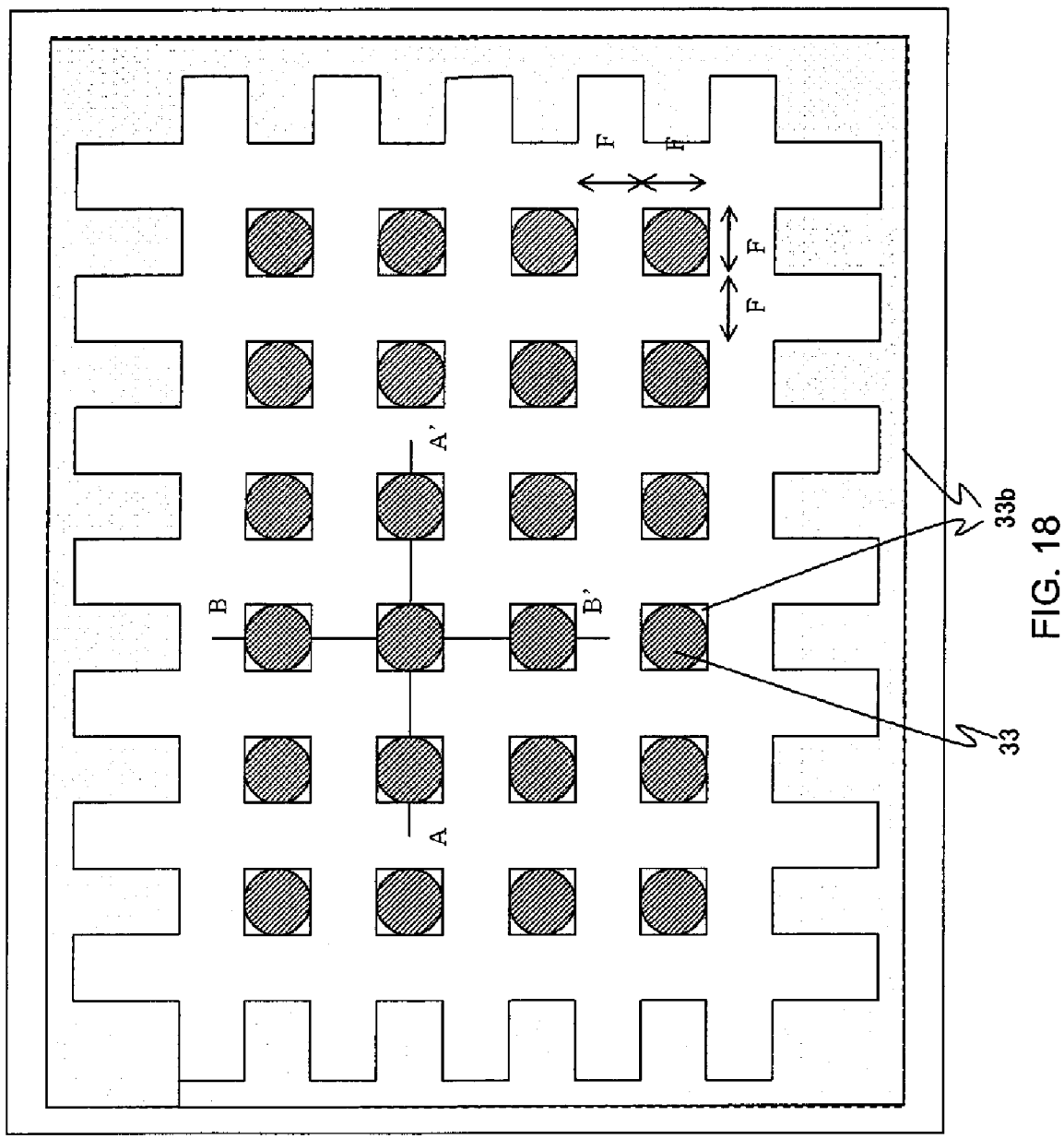
FIG. 18 is a cross-sectional view taken along a line corresponding to the line D3-D3' of FIGS. 17A and 17B.

FIG. 18 is a diagram showing the cross section of the DRAM (the planar shape of the capacitor contact conductive film 33a) taken along the plane corresponding to the line D3-D3' of FIGS. 17A and 17B. As described above, the capacitor contact pad 33b is separated to correspond to the respective capacitor contact plugs 33. The part (33b) of the capacitor contact conductive film 33a which has not been etched away is left remaining in the periphery of the memory cell array region. It is necessary to design the capacitor contact pad patterns 14 such that this remaining part will not intrude into a circuit region arranged in the periphery of the memory cell array.

Next, as shown in FIGS. 19A and 19B, a storage electrode conductive film 35a is formed to cover the surfaces of the stacked bodies 81. The storage electrode conductive film 35a may be a TiN film, for example. The TiN film may be formed, for example, by a CVD method. The storage electrode conductive film 35a is of a thickness of 10 nm, for example. The storage electrode conductive film 35a may be formed of a stacked film consisting of a Ti film and a TiN film, a high melting point metal film such as a Ru film, or a doped silicon film.

The formed storage electrode conductive film 35a is in contact with and electrically connected to the side surfaces of the capacitor contact conductive film 33a.

The sections of the storage electrode conductive film 35a formed on the adjacent side surfaces of the stacked capacitor bodies 81 are spaced apart from each other by a distance large enough to permit formation of the capacitor insulation film 36 and the upper electrode 37 (see FIGS. 3A and 3B). However, the smaller the distance is, the greater the area occupied by the capacitors is. When the distance F between the adjacent stacked capacitor bodies 81 is 50 nm and the thickness of the storage electrode conductive film 35a is 10 nm, the distance between the sections of the storage electrode conductive film 35a becomes 30 nm.

Figures 20A, 20B:
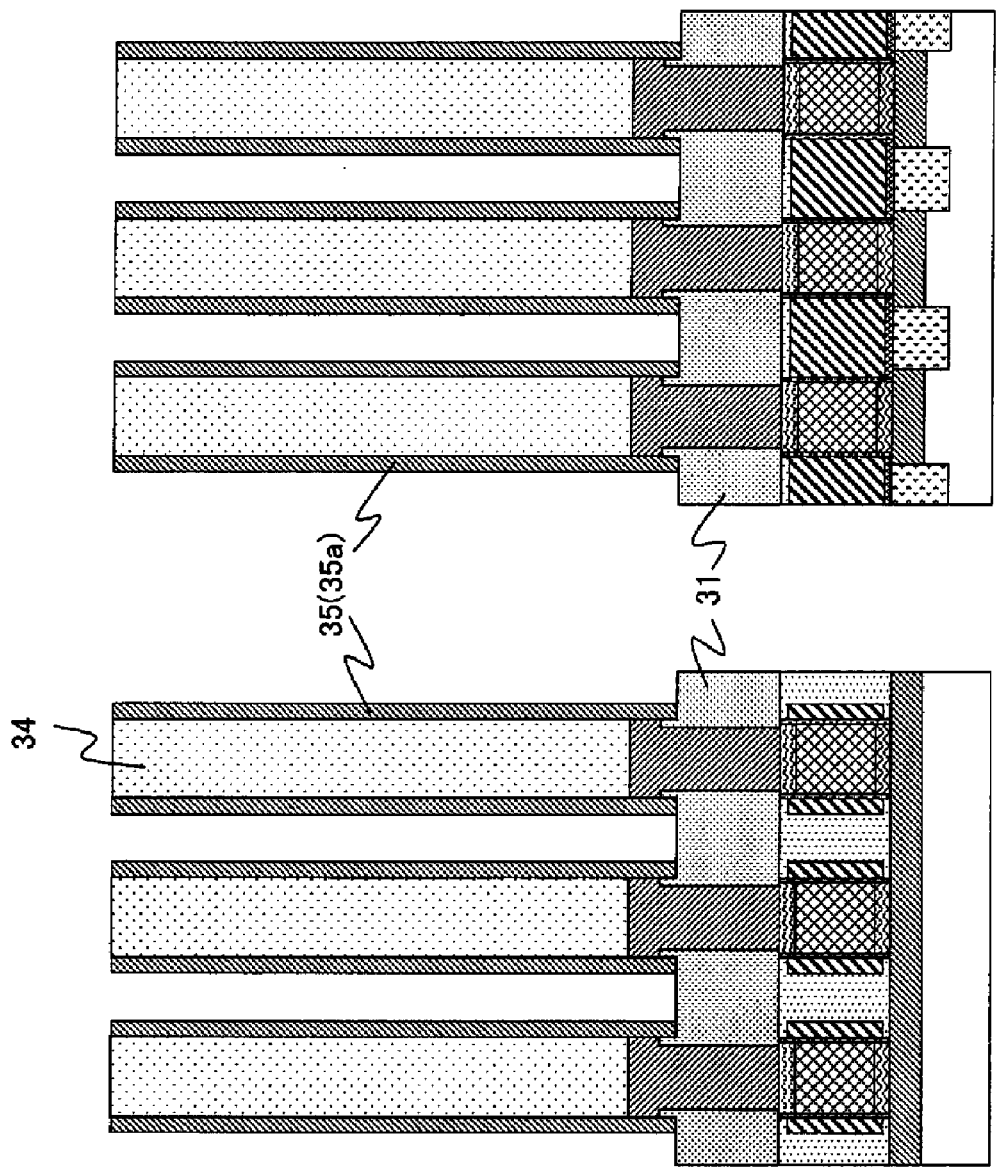
FIGS. 20A and 20B are process charts for explaining a process subsequent to the one shown in FIGS. 19A and 19B, FIG. 20A being a cross-sectional view taken along a line corresponding to the line A-A' of FIG. 2, FIG. 20B being a cross-sectional view taken along a line corresponding to the line B-B' of FIG. 2.

Next, as shown in FIGS. 20A and 20B, the storage electrode conductive film 35a covering the top surfaces of the stacked capacitor bodies 81 (the capacitor interlayer film 34) and the top surfaces of the second interlayer film 31 is removed by using a dry etching technique. This etching process exposes the surfaces of the second interlayer films 31 while leaving the storage electrode conductive films 35a on the side surfaces of the stacked capacitor bodies 81. The storage electrode conductive film 35a left on the side surfaces of the stacked capacitor bodies 81 forms storage electrodes (lower electrodes) 35.

According to this embodiment of the invention, the stacked capacitor body 81 is separated in the X- and Y-directions using the minimum possible processing dimensions of the photolithography technique. Therefore, the capacitor patterns can be formed while substantially preventing the shrinkage or the rounding of the corners. This makes it possible to utilize the planar region of a memory cell effectively for formation of the memory cell capacitor region. Additionally, according to the embodiment, the storage electrodes 35 to be used as the capacitors are formed on the side surfaces of the stacked capacitor bodies 81 formed using the minimum processing dimensions of the photolithography technique. This is equivalent of forming the storage electrodes in regions which are conventionally invalid regions utilized for isolation of the capacitors, and thus more effective utilization of the memory cell region is achieved.

According to the embodiment of the invention, the perimeter length of an expanded shape of the storage electrode 35 in each capacitor is represented approximately by $\{4\times(F+2\times d)+h\}\times 2$ where F indicates the length of a side of the stacked capacitor body 81, h indicates the height thereof, and d indicates the thickness of the storage electrode conductive film 35a. This perimeter length is about three times as great as that of a concave-type capacitor when F is 50 nm and d is 10 nm.

This is because, in a concave-type capacitor, the storage electrode is formed within a hole, and the hole itself is formed in a reduced size. When the perimeter length of the storage electrode 35 is three times as great as that of the concave-type capacitor, the capacitor according to the embodiment has a capacity three times greater compared to a concave-type capacitor with the same height.

Further, when the height of a capacitor is equal to or greater than the width of the capacitor as viewed in plane (herein, the width is F), the proportion of the area of the side surfaces of the capacitor to the total surface area becomes greater. Accordingly, increasing the length of the side surfaces (the height of the capacitor) is effective to increase the surface area (the area of the storage electrode). According to this embodiment of the invention, as described above, the capacitor can be processed more easily than the concave-type capacitor either by the photolithography technique or the etching technique. This makes it possible to form the capacitor with a greater height and hence with a greater capacity.

Further, according to the embodiment of the invention, the electrical connection between the storage electrode conductive film 35a and the capacitor contact plugs 33 is implemented by the contact between the storage electrode conductive film 35a and the capacitor contact pad 33b. In a concave-type capacitor according to a related art, in contrast, a storage electrode is connected to the top surface of a contact plug at the bottom of the capacitor hole. Therefore, the diameter of the aperture at the bottom of the capacitor hole becomes smaller as the height of the capacitor is increased, causing a problem of increased contact resistance. In addition, the increased contact resistance causes problems that the time required for writing and reading data is increased, and the amount of signals to read and write becomes short. According to the embodiment of the invention, the storage electrode is connected to the side surfaces of the contact pad instead of to the top surface of the contact plug. The area of the side surfaces of the contact pad can be increased easily by increasing the thickness t of the capacitor contact conductive film 33a. Moreover, the area of the side surfaces of the contact pad can be increased without the need of increasing the area of the memory cell. The contact area between the storage electrode conductive film 35a and the capacitor contact plug pad 33b according to the embodiment is about 4F×t. Therefore, when F is 50 nm, the resistance can be reduced compared to a concave-type capacitor by setting the thickness t of the capacitor contact conductive film 33a to about 10 nm. When a stacked film of W, TiN and Ti with a thickness t of 60 nm is used as the storage electrode conductive film 35a, a contact area which is five to ten times greater compared to that of the concave-type capacity can be achieved, and the contact resistance can be reduced to about 1/10 to 1/5.

Figures 21A, 21B:
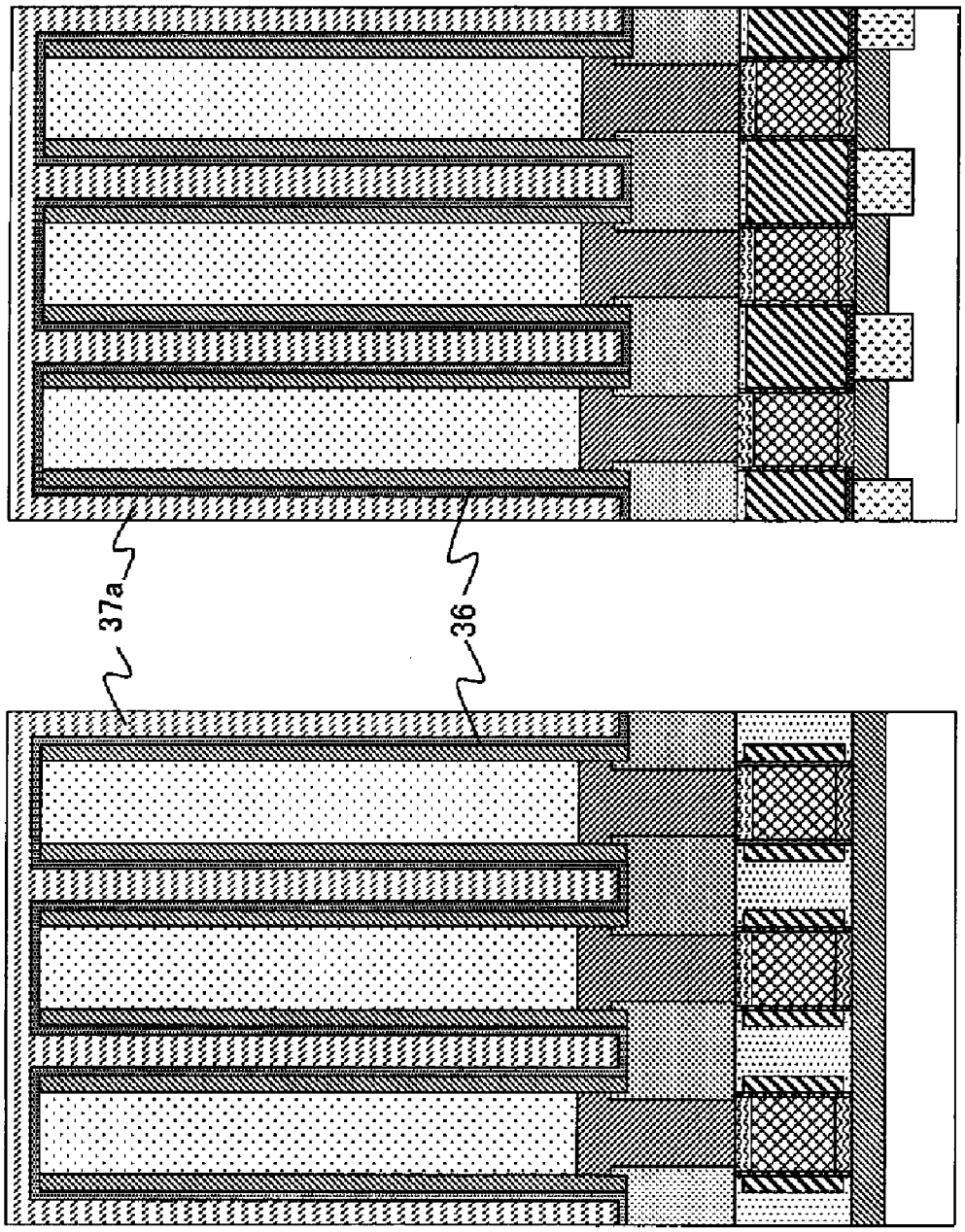
FIGS. 21A and 21B are process charts for explaining a process subsequent to the one shown in FIGS. 20A and 20B, FIG. 21A being a cross-sectional view taken along a line corresponding to the line A-A' of FIG. 2, FIG. 21B being a cross-sectional view taken along a line corresponding to the line B-B' of FIG. 2.

Next, as shown in FIGS. 21A and 21B, a capacitor insulation film 36 is formed and then an upper electrode conductive film 37a is formed thereon to provide an upper electrode 37.

The capacitor insulation film 36 may be formed of a $Ta_2O_5$ film, for example. The thickness of the capacitor insulation film 36 is 8 nm, for example. Alternatively, the capacitor insulation film 36 may be formed of a high-dielectric film such as $ZrO_2$, $HfO_2$, or STO.

The upper electrode conductive film 37a may be formed of a TiN film, for example. The thickness of the upper electrode conductive film 37a is 30 nm, for example. Alternatively, the upper electrode conductive film 37a may be formed of a high melting point metal film such as a Ru film, or of a doped silicon film.

When the storage electrode conductive films 35a formed on the side surfaces of the adjacent stacked capacitor bodies 81 are spaced from each other by a distance of 30 nm, and 8-nm thick capacitor insulation films 36 are formed on the surfaces thereof, the upper electrode conductive film 37a between the capacitor insulation films 36 has a thickness of 14 nm.

Next, a mask material having a mask pattern covering the memory cell array region is formed on the upper electrode conductive film 37a. The upper electrode conductive film 37a is etched using the formed mask material as mask to form an upper electrode 37. The mask material is removed after that.

In this manner, fabrication of a capacitor composed of the storage electrode 35, the capacitor insulation film 36, and the upper electrode 37 is completed.

Figures 22A, 22B:
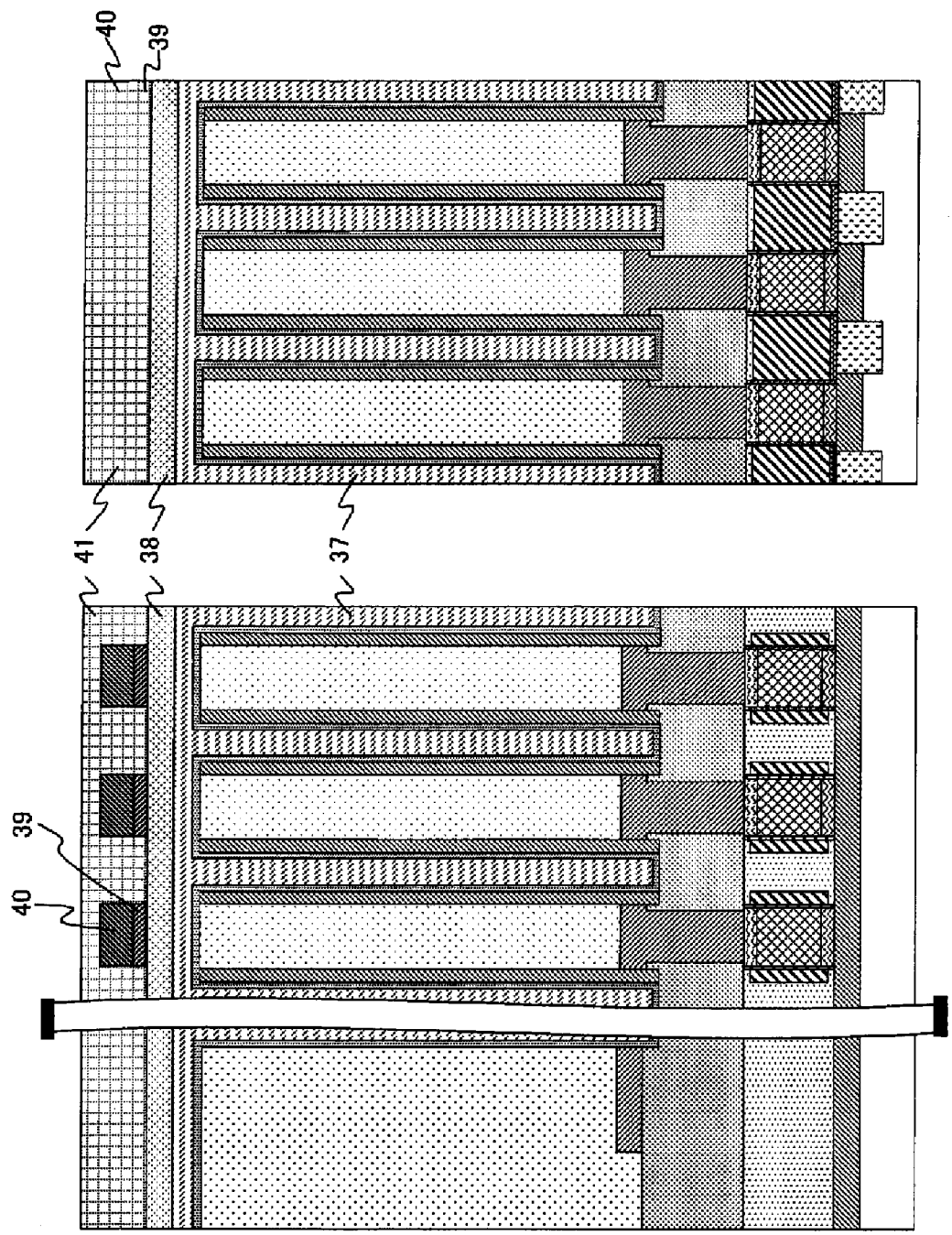
FIGS. 22A and 22B are process charts for explaining a process subsequent to the one shown in FIGS. 21A and 21B, FIG. 22A being a cross-sectional view taken along a line corresponding to the line A-A' and a-a' of FIG. 2, FIG. 22B being a cross-sectional view taken along a line corresponding to the line B-B' of FIG. 2.

Subsequently, as shown in FIGS. 22A and 22B, a third interlayer film 38, a barrier metal 39, Al—Cu wiring lines 40 and a fourth interlayer film 41 are formed.

The third interlayer film 38 is formed, for example, by forming a silicon oxide film on the upper electrode 37 and making the top surface thereof flat.

Prior to the formation of the barrier metal 39 and the Al—Cu wiring lines 40, contact holes are formed at predetermined positions in the third interlayer film 38. A conductive film is then grown to fill the contact holes and then the top surface of the conductive film is polished by CMP to form contact plugs (not shown). This conductive film may be a stacked film formed by successively depositing Ti, TiN and W.

After that, a barrier metal layer and an Al—Cu layer are successively formed as a wiring material. The barrier metal layer may be formed of a stacked film consisting of a Ti film and a TiN film. The Al—Cu layer and the barrier metal layer are patterned by a photolithography technique and a dry etching technique, so that the Al—Cu wiring lines 40 and the barrier metal layer 39 are formed.

The fourth interlayer film 41 functions as a passivation film covering the Al—Cu wiring lines 40. The fourth interlayer film 41 is formed with an aperture to expose a part of the Al—Cu wiring lines 40, that is, the part to be used as bonding pads.

A semiconductor device can be obtained by the processing steps described above.

The left-hand side of FIG. 22A is a diagram showing a cross section taken along a line corresponding to the line a-a' of FIG. 2, and shows an end of the capacitor contact pad.

According to this embodiment of the invention, as described above, the mask patterns used for formation of the capacitors are line-and-space patterns in which line patterns are repeated at the same pitch. The line-and-space patterns exhibit excellent exposure resolution when formed by using a photolithography technique, enabling formation of finer patterns and use of a photoresist film of a greater thickness. The use of a photoresist film (mask) of a greater thickness enables deeper processing in the subsequent dry etching process. This means that the use of a thick photoresist mask makes it possible to dry-etch a capacitor interlayer film of a greater thickness, and thus to increase the capacity of the capacitor. Further, the overetching amount during etching of the capacitor interlayer film can be increased, and thus the etching performance can be improved.

Furthermore, according to the embodiment, the dry etching for forming a capacitor with a high aspect ratio is performed using line-and-space patterns, whereby etching ions are allowed to reach an object to be etched more easily. This enables formation of finer patterns and deeper etching. Additionally, a reaction product produced during the etching is easy to be discharged, which eliminates the problems such as etching stop and enables highly accurate etching. As a result, a capacitor interlayer film of a greater thickness can be used to form a capacitor with an increased capacity without increasing the area of a memory cell.

Still further, according to the embodiment of the invention, the contact between a storage electrode conductive film and a capacitor contact plug is implemented at side surfaces of the capacitor contact plug (or a capacitor contact pad), whereby it is made possible to increase the contact area without increasing the area of a memory cell by increasing the thickness of the capacitor contact conductive film, and hence possible to reduce the contact resistance.

Still further, according to the embodiment of the invention, capacitors are isolated from each other in the X- and Y-directions using the minimum processing dimensions of the photolithography technique. This makes it possible to utilize the memory cell region as efficiently as possible for formation of the capacitors. The capacitors are formed on the side surfaces of the stacked capacitor bodies formed using the minimum processing dimensions of the photolithography technique, whereby the invalid region used only for capacitor isolation can be reduced or eliminated, and the memory cell region can be utilized efficiently.

Although this invention has been described in conjunction with a few preferred embodiments thereof, this invention is not limited to the foregoing embodiments but may be altered or modified in various other manners within the scope of the invention.

For example, although the embodiment above has been described in terms of a case in which the memory cell transistor is a pillar-type MOS transistor, the transistor structure is not limited to this but may be a planar-type transistor.

Further, although the embodiment above has been described in terms of a case in which the invention is applied to a DRAM, the application of the invention is not limited to this, but may be applicable to other devices in which electrodes having a three-dimensional structure are formed, such as a RRAM (Resistive Random Access Memory), a PRAM (Phase change type Random Access Memory), and a FRAM (Ferric Random Access Memory).

Further, although the embodiment above has been described in terms of a case in which memory cells are arranged at pitches of 2F both in vertical and transverse directions, the invention is not limited to this. However, the invention provides more beneficial effects when the memory cells are arranged at pitches of 2F both in vertical and transverse directions.

Further, although the embodiment above has been described in terms of a case in which the line patterns of the first and second capacitor patterns (extending in the first and second directions) are mutually orthogonal, the invention is also applicable to a case in which they are not orthogonal but intersect with each other at an angle other than 90 degrees.

What is claimed is:

1. A device comprising:
    a pillar body formed on a semiconductor substrate and having side surfaces consisting of two side surfaces approximately parallel in a first direction and two side surfaces approximately parallel in a second direction different from the first direction, the pillar body having a first part formed of a first insulation film;
    a first electrode formed on the side surfaces, and formed of a first conductive film; and
    a second conductive film formed to extend from an inside of a contact hole formed in an interlayer film to an upper surface of the interlayer film,
    wherein the first insulation film is formed on the second conductive film, and the pillar body includes a second part formed of the second conductive film located under the first insulation film.

2. The device as claimed in claim 1, wherein the pillar body is repeatedly arranged in plurality with translational symmetry along the first and second directions.

3. The device as claimed in claim 2, wherein the first direction and the second directions are orthogonal to each other.

4. The device as claimed in claim 3, comprising:
    a transistor having a gate electrode, a first source/drain region, and a second source/drain region connected to the first conductive film;
    a word line connected to the gate electrode and extending in the first direction; and
    a bit line connected to the first source/drain region and extending in the second direction.

5. The device as claimed in claim 4, wherein:
    when F indicates a processing dimension, the word line is arranged in plurality at a pitch of 2F in the second direction, the bit line being arranged in plurality at a pitch of 2F in the first direction; and
    the pillar body is arranged at each of a plurality of intersections between the word lines and the bit lines.

6. The device as claimed in claim 5, wherein:
    the transistor has a semiconductor pillar element made of a semiconductor material;
    the gate electrode is formed on side surfaces of the semiconductor pillar portion with a gate insulation film interposed therebetween;
    the first source/drain region is formed in a lower part of the semiconductor pillar portion; and
    the second source/drain region is formed in an upper part of the semiconductor pillar portion.

7. The device as claimed in claim 1, comprising a second insulation film covering the first electrode and the pillar body, and a second electrode formed on the second insulation film.

8. A device manufacturing method comprising:
    forming a first insulation film on a semiconductor substrate;
    forming a first mask on the first insulation film, the first mask having a linear pattern and extending in a first direction;
    etching the first insulation film using the first mask as mask to process the first insulation film into a linear body;
    forming a second mask on the linear body, the second mask having a linear pattern and extending in a second direction different from the first direction;
    etching the linear body using the second mask as mask to process the linear body into a pillar body;
    forming a first conductive film to cover the pillar body; and
    etching the first conductive film to form a first electrode formed of the first conductive film on side surfaces of the pillar body,
    wherein the first and second directions are first and second horizontal directions to the substrate.

9. The method as claimed in claim 8, further comprising, prior to the forming the first insulation film:
    forming an interlayer film on the semiconductor substrate;
    forming a contact hole in the interlayer film;
    forming a second conductive film, on which the first insulation film is formed, to extend from an inside of the contact hole to an upper surface of the interlayer film;
wherein the method further comprises:
    etching a first part of the second conductive film continuously after the etching the first insulation film; and etching a second part of the second conductive film continuously after the etching the linear body.

10. The method as claimed in claim 9, further comprising:

etching a first part of the interlayer film continuously after the etching the first part of the second conductive film; and etching a second part of the interlayer film continuously after the etching the second part of the second conductive film.

11. The method as claimed in claim 10, wherein:

the first mask is repeatedly arranged in plurality at a first pitch in a direction orthogonal to the first direction;

the second mask is repeatedly arranged in plurality at a second pitch in a direction orthogonal to the second direction; and the pillar body is formed in each of regions where the first mask and the second mask intersect with each other.

12. The method as claimed in claim 11, wherein the first direction and the second direction are orthogonal to each other.

13. The method as claimed in claim 12, wherein the forming the first mask and the forming the second mask are carried out such that the first pitch is equal to the second pitch.

14. The method as claimed in claim 9, further comprising, prior to the forming the interlayer film, forming a transistor on the semiconductor substrate, the transistor having first and second source/drain regions one of which is electrically connected to the second conductive film.

15. The method as claimed in claim 14, wherein the forming the transistor comprises:

forming a pillar element on the semiconductor substrate;

forming the first source/drain region at a bottom of the pillar element;

forming the second source/drain region in an upper part of the pillar element, the second source/drain region being electrically connected to the first conductive film; and forming a gate electrode on a side surface of the pillar element with a gate insulation film interposed therebetween.

16. The method as claimed in claim 15, further comprising:

forming a bit line on the semiconductor substrate, the bit line extending in one of the first and second directions and being connected to the first source/drain region; and forming a word line connected to the gate electrode and extending in the other of the first and second directions.

17. The method as claimed in claim 8, further comprising, after the etching the first conductive film to form the first electrode:

forming a second insulation film to cover the first electrode; and etching a third conductive film to form a second electrode formed of the third conductive film on the second insulation film on side surfaces of the pillar body.

18. A device comprising:

a transistor having a source/drain region;

a pillar body having a conductive part coupled to the source/drain region and an insulation part disposed on the conductive part, the pillar body having side surfaces consisting of two side surfaces approximately parallel in a first direction and two surfaces approximately parallel in a second direction different from the first direction;

a first electrode disposed on the side surfaces of the pillar body to couple with the conductive part;

a gate insulating film covering the first electrode and the pillar body; and a second electrode disposed on the gate insulating film to form a capacitor together with the first electrode, wherein the first electrode is directly connected to the conductive part and the second electrode is directly formed on the gate insulating film so that the first electrode, the gate insulating film and the second electrode constitute the capacitor.

19. The device claimed as claim 18, wherein the capacitor is repeatedly arranged in plurality with translational symmetry along the first and second directions.

* * * * *